(12) United States Patent
Lee et al.

(10) Patent No.: US 11,251,169 B2
(45) Date of Patent: Feb. 15, 2022

(54) METHOD OF FABRICATING SEMICONDUCTOR PACKAGE AND SEMICONDUCTOR PACKAGE

(71) Applicant: SAMSUNG ELECTRONICS CO., LTD., Suwon-si (KR)

(72) Inventors: Tae-Young Lee, Incheon (KR); Dongok Kwak, Hwaseong-si (KR); Boseong Kim, Gyeonggi-do (KR); Sang Sub Song, Suwon-si (KR); Joonyoung Oh, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 138 days.

(21) Appl. No.: 16/549,917

(22) Filed: Aug. 23, 2019

(65) Prior Publication Data
US 2020/0203325 A1 Jun. 25, 2020

(30) Foreign Application Priority Data

Dec. 19, 2018 (KR) .................. 10-2018-0164907

(51) Int. Cl.
*H01L 23/31* (2006.01)
*H01L 25/10* (2006.01)
(Continued)

(52) U.S. Cl.
CPC ........ *H01L 25/105* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 23/552* (2013.01); *H01L 24/19* (2013.01); *H01L 24/20* (2013.01); *H01L 25/0652* (2013.01); *H01L 25/0657* (2013.01); *H01L 25/50* (2013.01); *H01L 2221/68372* (2013.01); *H01L 2224/214* (2013.01); *H01L 2225/06506* (2013.01); *H01L 2225/06513* (2013.01); *H01L 2225/06537* (2013.01); *H01L 2225/06562* (2013.01); *H01L 2225/06586* (2013.01); *H01L 2225/1035* (2013.01); *H01L 2225/1052* (2013.01);
(Continued)

(58) Field of Classification Search
None
See application file for complete search history.

(56) References Cited

U.S. PATENT DOCUMENTS 6,268,642 B1 7/2001 Hsuan et al.
7,144,800 B2 12/2006 Mostafazadeh et al.
(Continued)

*Primary Examiner* — Jack S Chen
(74) *Attorney, Agent, or Firm* — Volentine, Whitt & Francos, PLLC

(57) ABSTRACT

A method of fabricating a semiconductor package includes preparing a panel package including a redistribution substrate, a connection substrate and a plurality of lower semiconductor chips; sawing the panel package to form a plurality of separated strip packages each of which includes the sawed redistribution substrate, at least two of the lower semiconductor chips, and the sawed connection substrate; and providing a plurality of upper semiconductor chips on one of the strip packages to electrically connect the upper semiconductor chips to the sawed connection substrate.

17 Claims, 29 Drawing Sheets

(51) Int. Cl.
  *H01L 23/538* (2006.01)
  *H01L 23/552* (2006.01)
  *H01L 23/00* (2006.01)
  *H01L 25/065* (2006.01)
  *H01L 21/48* (2006.01)
  *H01L 21/56* (2006.01)
  *H01L 21/683* (2006.01)
  *H01L 21/78* (2006.01)
  *H01L 25/00* (2006.01)

(52) U.S. Cl.
  CPC .............. *H01L 2225/1058* (2013.01); *H01L 2924/3025* (2013.01)

(56) References Cited

U.S. PATENT DOCUMENTS

| | | |
|---|---|---|
| 8,022,527 B2 | 9/2011 | Haba et al. |
| 8,461,673 B2 | 6/2013 | Haba et al. |
| 8,539,408 B1 | 9/2013 | Cheng et al. |
| 8,581,407 B2 | 11/2013 | Salmon |
| 8,933,473 B1 | 1/2015 | Dubin |
| 8,957,516 B2 | 2/2015 | Pang et al. |
| 9,005,367 B2 | 4/2015 | Klipp |
| 9,146,471 B2 | 9/2015 | Klipp |
| 9,207,719 B2 | 12/2015 | Ho et al. |
| 9,472,533 B2 | 10/2016 | Pendse |
| 10,043,761 B2 | 8/2018 | Wang et al. |
| 10,109,617 B2 * | 10/2018 | Lee ............. H01L 21/561 |
| 10,115,613 B2 | 10/2018 | Chang et al. |
| 10,135,211 B2 | 11/2018 | Lloyd et al. |
| 10,153,219 B2 | 12/2018 | Jeon et al. |
| 10,157,886 B2 | 12/2018 | Park et al. |
| 2005/0140026 A1 | 6/2005 | Salmon |
| 2007/0037320 A1 | 2/2007 | Mostafazadeh et al. |
| 2008/0136004 A1 | 6/2008 | Yang et al. |
| 2010/0053407 A1 | 3/2010 | Crisp et al. |
| 2013/0187284 A1 | 7/2013 | Pang et al. |
| 2015/0279775 A1 | 10/2015 | Ho et al. |
| 2016/0329272 A1 | 11/2016 | Geissler et al. |
| 2018/0026010 A1 | 6/2018 | Huang et al. |

* cited by examiner

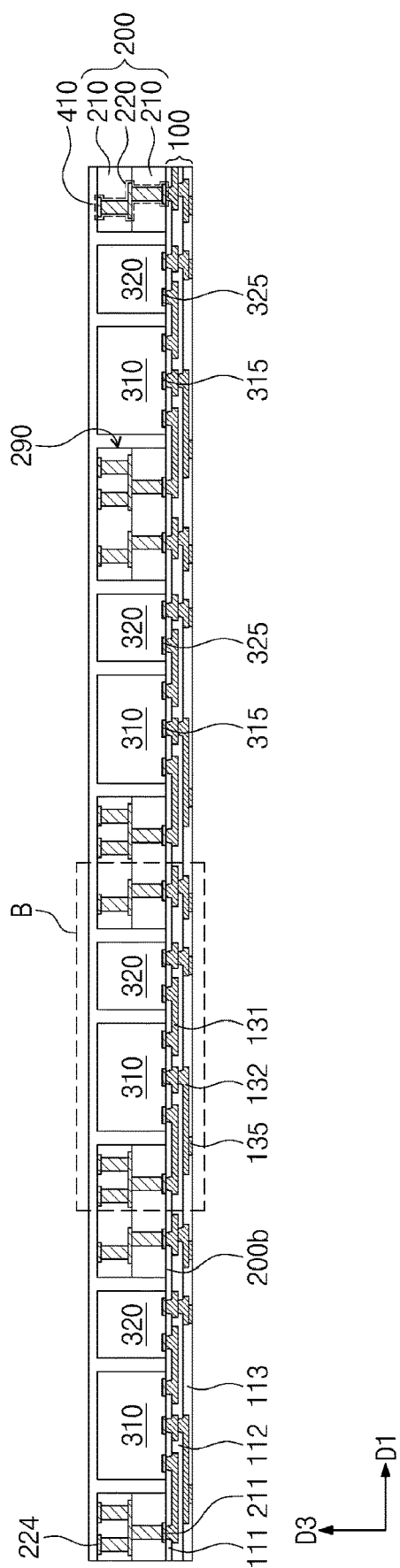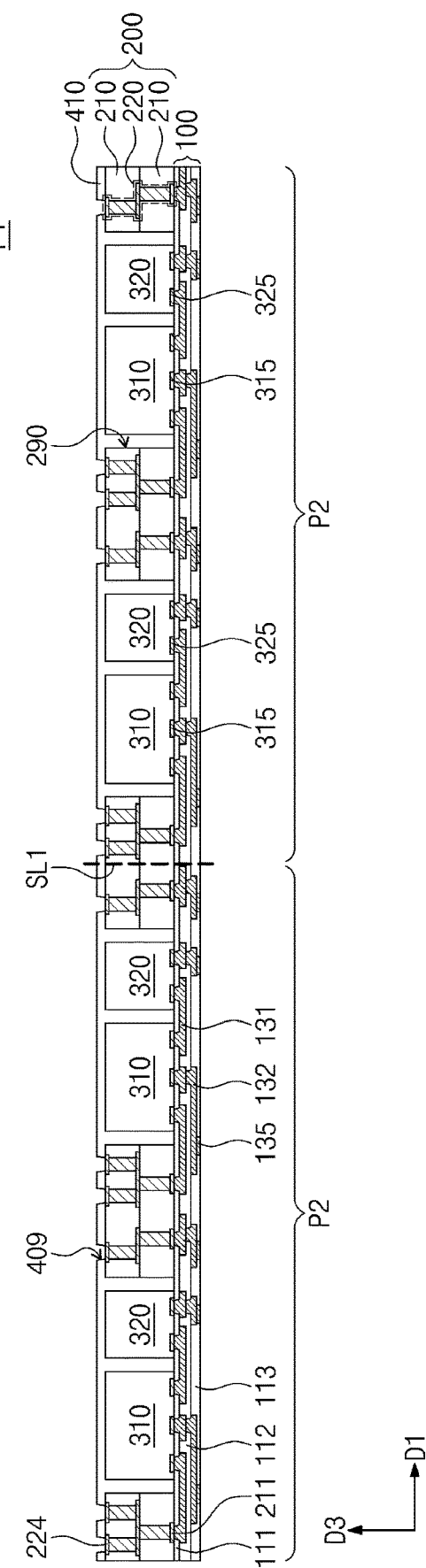

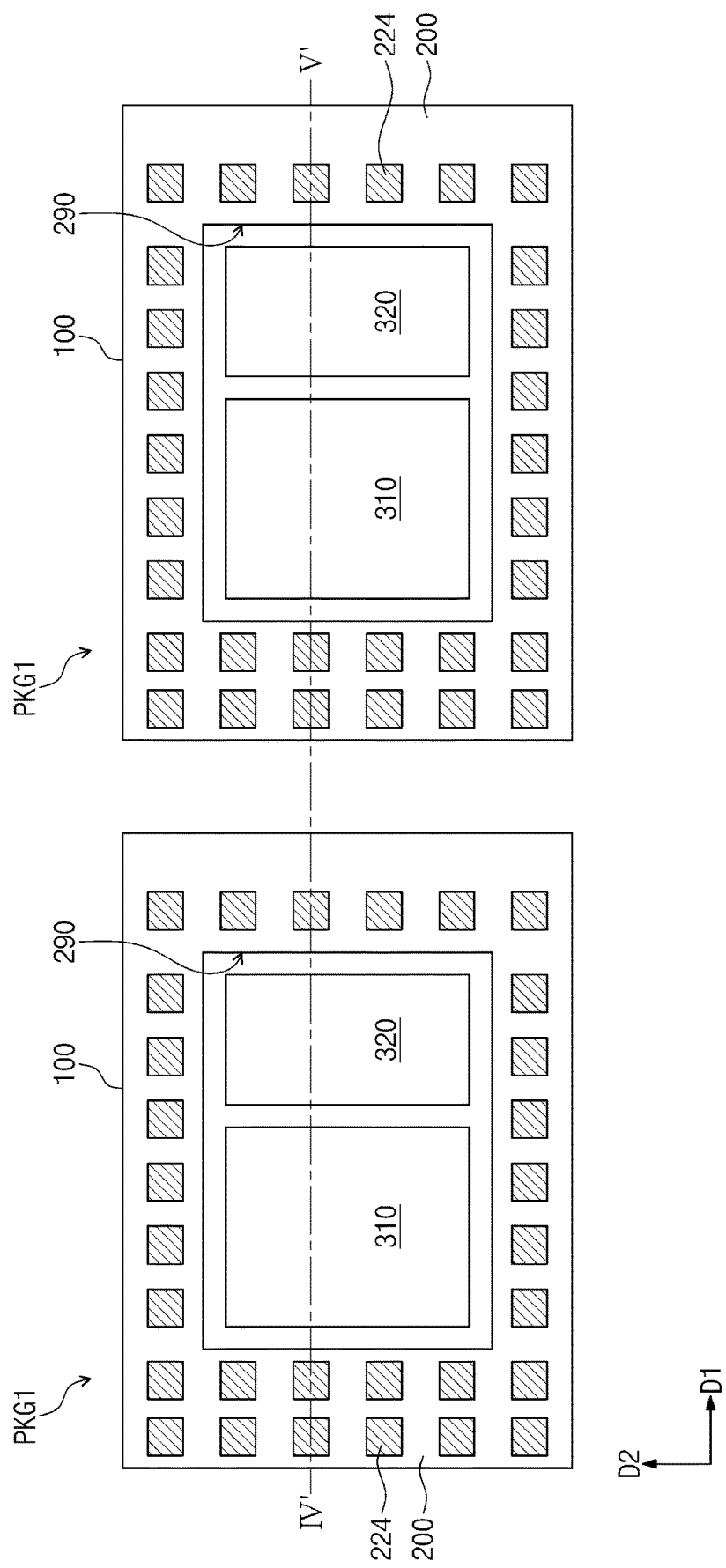

METHOD OF FABRICATING SEMICONDUCTOR PACKAGE AND SEMICONDUCTOR PACKAGE

CROSS-REFERENCE TO RELATED APPLICATION

A claim of priority under 35 U.S.C. § 119 is made to Korean Patent Application No. 10-2018-0164907 filed on Dec. 19, 2018 in the Korean Intellectual Property Office, the entire contents of which are hereby incorporated by reference.

BACKGROUND

The present inventive concepts relate to a semiconductor package, and more particularly to a method of fabricating a semiconductor package including a redistribution substrate.

Semiconductor packages have been developed and provided to implement integrated circuit chips for use in electronic products. Semiconductor packages are typically configured such that a semiconductor chip is mounted on a printed circuit board, and bonding wires or bumps are used to electrically connect the semiconductor chip to the printed circuit board. Because there is demand for smaller and more compact electronic products, there is a need to reduce the size of semiconductor packages.

SUMMARY

Embodiments of the inventive concepts provide a compact-sized semiconductor package and a method of fabricating the same.

Embodiments of the inventive concepts provide a method of fabricating a semiconductor package that includes preparing a panel package, the panel package including a redistribution substrate, a connection substrate on the redistribution substrate and a plurality of lower semiconductor chips on the redistribution substrate; sawing the panel package to form a plurality of strip packages separated from each other, each of the strip packages including a sawed portion of the redistribution substrate, at least two of the lower semiconductor chips, and a sawed portion of the connection substrate; and providing a plurality of upper semiconductor chips on one of the strip packages and electrically connecting the upper semiconductor chips to the sawed portion of the connection substrate of the one of the strip packages.

Embodiments of the inventive concepts further provide a method of fabricating a semiconductor package that includes preparing a strip package, the strip package including a redistribution substrate, a connection substrate on the redistribution substrate, a plurality of lower semiconductor chips mounted on the redistribution substrate, and a lower molding layer covering the lower semiconductor chips; placing a plurality of upper semiconductor chips on the strip package, at least two of the upper semiconductor chips being laterally spaced apart from each other; and forming a plurality of connection terminals directly connected to the upper semiconductor chips and the connection substrate.

Embodiments of the inventive concepts still further provide a method of fabricating a semiconductor package that includes forming a preliminary package; mounting a plurality of upper semiconductor chips on the preliminary package, at least two of the upper semiconductor chips being laterally spaced apart from each other; and performing a sawing process on the preliminary package to provide separate packages. The forming the preliminary package includes providing a connection substrate on a temporary substrate; providing a plurality of lower semiconductor chips on the temporary substrate; removing the temporary substrate to expose bottom surfaces of the lower semiconductor chips and a bottom surface of the connection substrate; and forming a redistribution substrate on the bottom surfaces of the lower semiconductor chips and the bottom surface of the connection substrate exposed by the removing the temporary substrate.

Embodiments of the inventive concepts also provide a semiconductor package including a redistribution substrate; a connection substrate having at least one lower semiconductor chip on the redistribution substrate; a lower molding layer covering the connection substrate, and top and side surfaces of the at least one lower semiconductor chip, the connection substrate including at least one conductive structure disposed therethrough, the at least one conductive structure having at least one upper pad at a top surface of the connection substrate and exposed through the lower molding layer; a plurality of upper semiconductor chips on the lower molding layer; a plurality of first connection terminals directly coupled to chip pads of the upper semiconductor chips and the at least one upper pad of the at least one conductive structure; and an upper molding layer covering the upper semiconductor chips and directly contacting the lower molding layer.

BRIEF DESCRIPTION OF THE DRAWINGS

Embodiments of the inventive concepts will be described in detail with reference to the accompanying drawings.

FIGS. 2D and 2E illustrate further cross-sectional views taken along line I-II of FIG. 2A showing a method of fabricating a panel package according to embodiments of the inventive concepts.

FIG. 4D illustrates a plan view showing separated semiconductor packages according to embodiments of the inventive concepts.

DETAILED DESCRIPTION OF EMBODIMENTS

Figure 1:
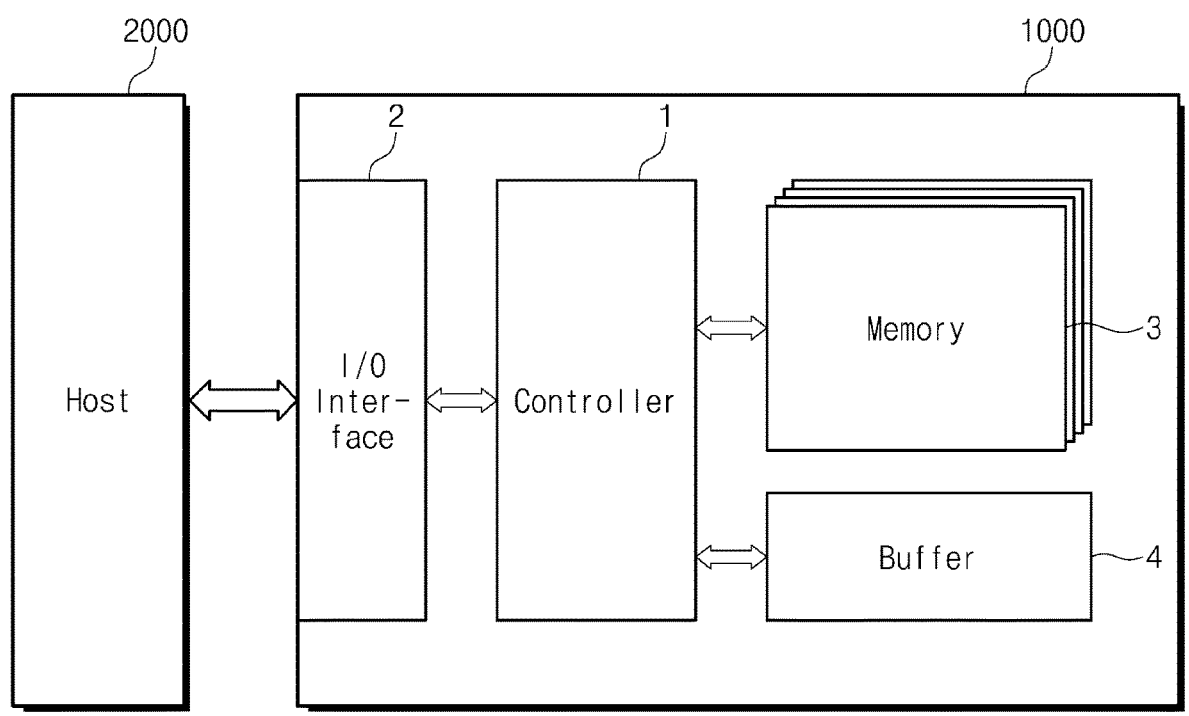
FIG. 1 illustrates a simplified block diagram showing a semiconductor package according to embodiments of the inventive concepts.

A semiconductor package and a fabrication method according to embodiments of the inventive concepts will be hereinafter described. Like reference numerals may indicate like components throughout the description.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a simplified block diagram showing a semiconductor package according to embodiments of the inventive concepts.

Referring to FIG. 1, the semiconductor package may be a solid state drive package 1000. The solid state drive package 1000 may store or read data in response to read/write requests from a host 2000. The host 2000 may be an external electronic device. The solid state drive package 1000 as shown includes a controller 1, an input/output (I/O) interface 2, a memory device (memory) 3, and a buffer memory device (buffer) 4. In some embodiments, the solid state drive package 1000 may include additional components.

The controller 1 may be a solid state drive (SSD) controller. The controller 1 may communicate signals with the host 2000 through the input/output interface 2. The signals between the controller 1 and the host 2000 may include command, address, data, and so on. In response to the command from the host 2000, the controller 1 may write data in or read data from the memory device 3, which will be described hereinafter.

The input/output interface 2 may provide a physical connection between the host 2000 and the solid state drive package 1000. For example, compatible with the bus format of the host 2000, the input/output interface 2 may be configured according to any of a variety of different communication protocols such as for example USB (Universal Serial Bus), PCI (Peripheral Component Interconnection) express, SATA (serial AT Attachment), PATA (Parallel AT Attachment), or the like.

The memory device 3 may be a nonvolatile memory device. As shown, a plurality of memory devices 3 may be included. The memory devices 3 may be NAND flash memory having large capacity and high-speed storage capability. In some embodiments, the memory devices 3 may for example be phase change random access memory (PRAM), magnetic random access memory (MRAM), resistive random access memory (ReRAM), ferromagnetic random access memory (FRAM), NOR flash memory, or the like.

The buffer memory device 4 may temporarily store data communicated between the controller 1 and the memory devices 3, and data communicated between the controller 1 and the host 2000. In addition, the buffer memory device 4 may also be used to drive software for effective management of the memory devices 3. The buffer memory device 4 may consist of random access memory, such as DRAM or SRAM. In some embodiments, the buffer memory device 4 may be nonvolatile memory such as for example flash memory, PRAM, MRAM, ReRAM, FRAM, or the like.

Figure 2A:
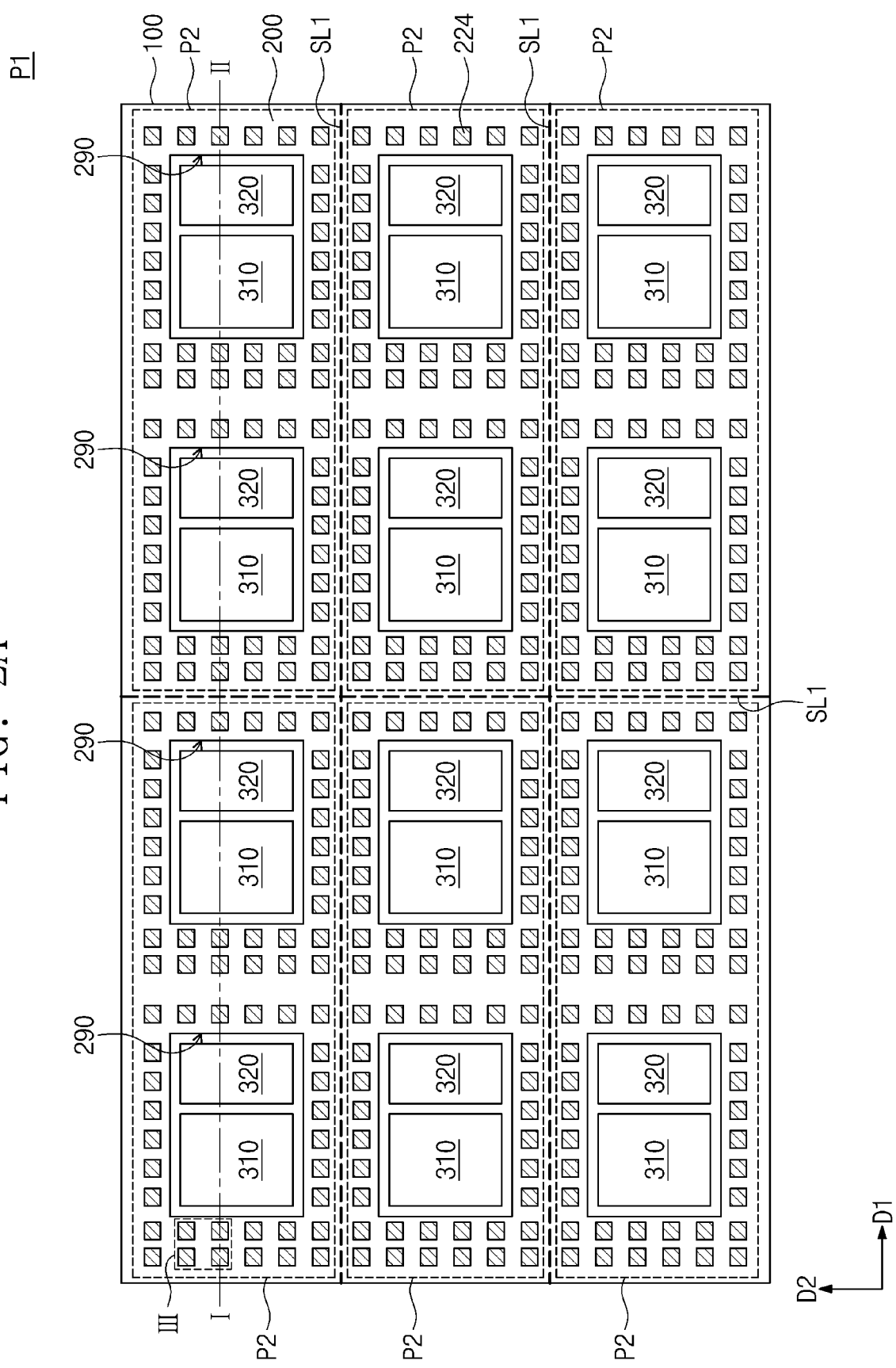
FIG. 2A illustrates a plan view showing a panel package of strip packages according to embodiments of the inventive concepts.
Figure 2B:
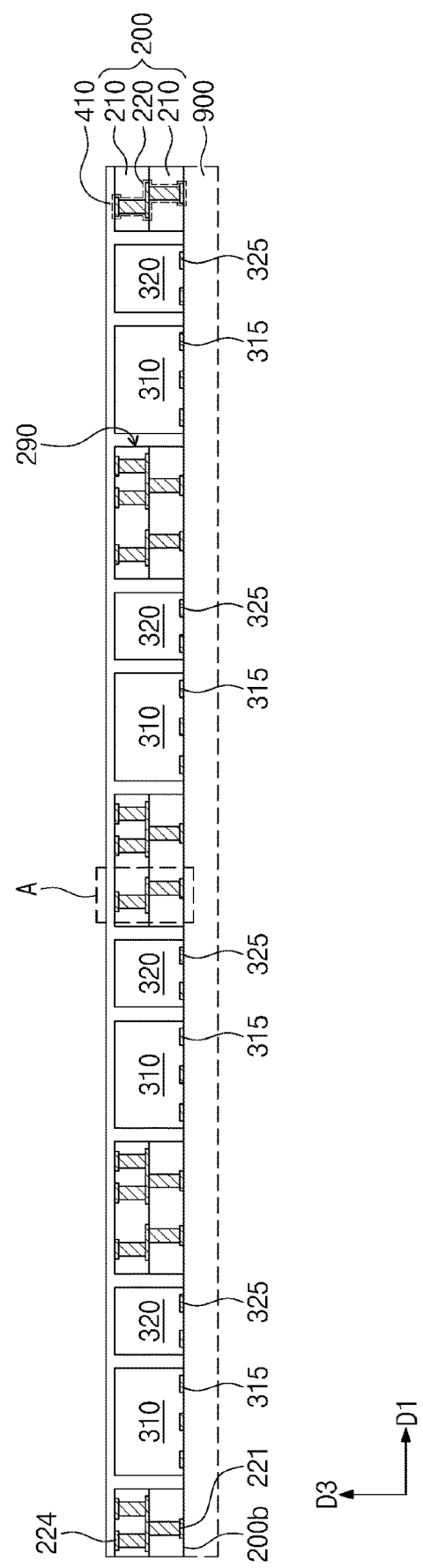
FIG. 2B illustrates a cross-sectional view taken along line I-II of FIG. 2A showing a method of fabricating a panel package according to embodiments of the inventive concepts.
Figure 2C:
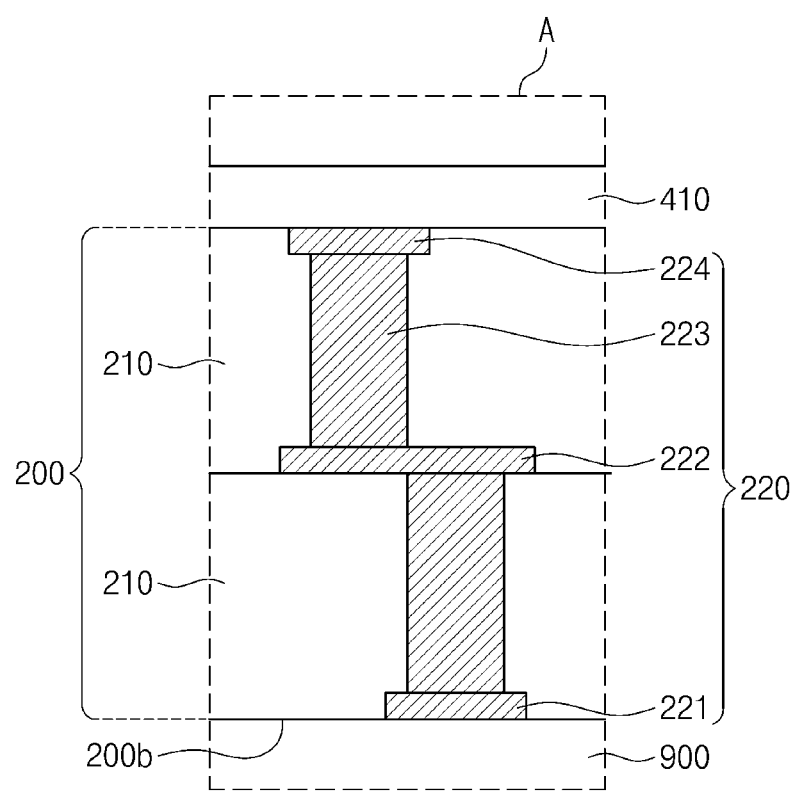
FIG. 2C illustrates an enlarged view showing section A of FIG. 2B.
Figure 2F:
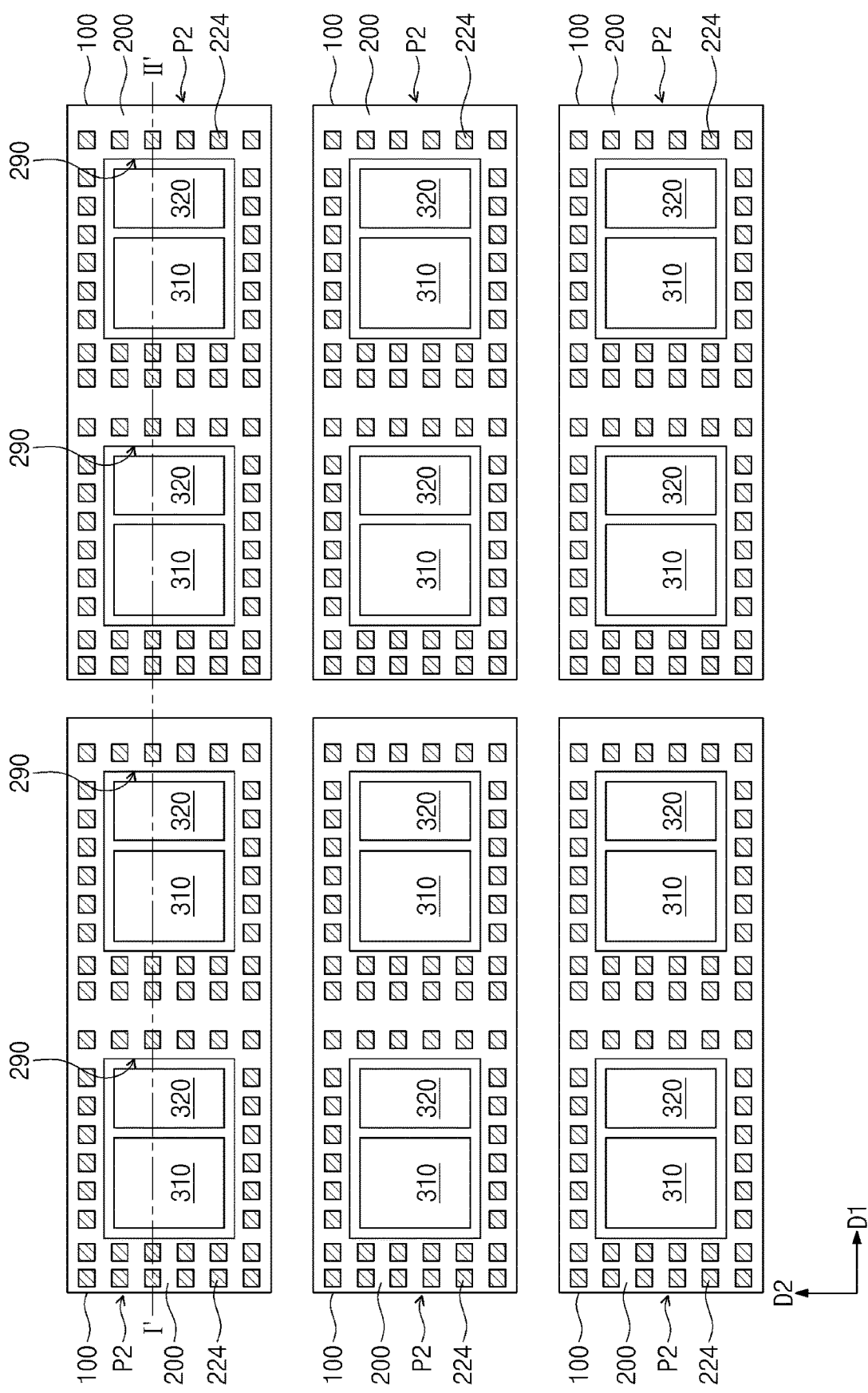
FIG. 2F illustrates a plan view showing separated strip packages of the panel package according to embodiments of the inventive concepts.
Figure 2G:
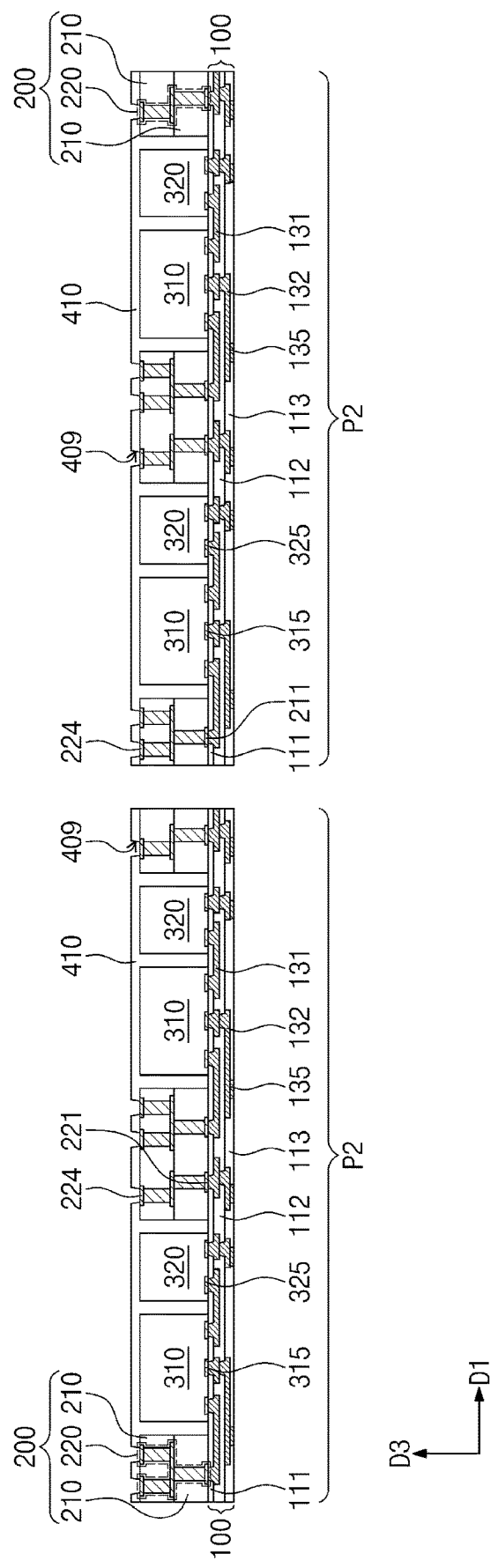
FIG. 2G illustrates a cross-sectional view taken along line I'-II' of FIG. 2F.

FIG. 2A illustrates a plan view showing a panel package of strip packages according to embodiments of the inventive concepts. FIGS. 2B, 2D, and 2E illustrate cross-sectional views taken along line I-II of FIG. 2A, showing a method of fabricating a panel package according to embodiments of the inventive concepts. FIG. 2C illustrates an enlarged view showing section A of FIG. 2B. FIG. 2F illustrates a plan view showing separated strip packages of the panel package according to embodiments of the inventive concepts. FIG. 2G illustrates a cross-sectional view taken along line I'-II' of FIG. 2F.

Referring to FIGS. 2A, 2B, and 2C, a temporary substrate 900 is provided, with a connection substrate 200 and lower semiconductor chips 310 and 320 disposed thereon. The connection substrate 200 may be a panel-level substrate. For example, a printed circuit board (PCB) may be used as the connection substrate 200. The connection substrate 200 has holes 290 penetrating therethrough. For example, the holes 290 may penetrate through a top surface and a bottom surface 200b of the connection substrate 200.

The connection substrate 200 includes base layers 210 and conductive structures 220. The base layers 210 may be stacked on each other. The base layers 210 may include a dielectric material. The conductive structures 220 may be provided in the base layers 210. As illustrated in FIG. 2C, the conductive structure 220 may include a lower pad 221, a connection line pattern 222, vias 223, and an upper pad 224. In some embodiments, a plurality of the lower pads 221 may be exposed on the bottom surface 200b of the connection substrate 200. The bottom surface 200b of the connection substrate 200 may correspond to a bottom surface of a lowermost one of the base layers 210. The vias 223 may penetrate at least one of the base layers 210. The connection line pattern 222 is interposed between the base layers 210 and coupled to the vias 223. The upper pad 224 may be exposed on the top surface of the connection substrate 200 and coupled to at least one of the vias 223. The top surface of the connection substrate 200 may correspond to a top surface of an uppermost one of the base layers 210. The upper pad 224 may be electrically connected to the lower pad 221 through the connection line pattern 222 and the vias 223. In this configuration, arrangement and pitch of the upper pad 224 may be freely designed without being limited to the arrangement and/or pitch of the lower pad 221. For example, the upper pad 224 may not be aligned with the lower pad 221 in (or along) a third direction D3. In this description, the third direction D3 may be defined to refer to a direction perpendicular to the plane along which the bottom surface 200b of the connection substrate 200 is disposed, and first and second directions D1 and D2 may be defined to refer to directions that extend parallel to the bottom surface 200b of the connection substrate 200. The first direction D1 as shown intersects the second direction D2. In this description, the phrase "vertically aligned with" may mean "aligned in the third direction D3." A plurality of upper pads 224 may be provided. The number of the lower pads 221 may be different from the number of the upper pads 224 electrically connected to the lower pads 221. In this description, the phrase "electrically connected to the connection substrate 200" may mean "electrically connected to the conductive structure 220."

The lower semiconductor chips 310 and 320 are provided on the temporary substrate 900. The lower semiconductor chips 310 and 320 may include first lower semiconductor chips 310 and second lower semiconductor chips 320. The first lower semiconductor chips 310 are provided in corresponding holes 290 of the connection substrate 200. Each of the first lower semiconductor chips 310 may be spaced apart from an inner sidewall of the connection substrate 200. Each of the first lower semiconductor chips 310 may serve as the controller 1 described with respect to FIG. 1. Each of the first lower semiconductor chips 310 may include integrated circuits (not shown) and chip pads 315 electrically connected to the integrated circuits. The integrated circuits may for example include transistors, logic circuits, memory circuits, or a combination thereof. The chip pads 315 may be exposed on a bottom surface of each of the first lower semiconductor chips 310. The chip pads 315 may include metal, such as aluminum for example. In this description, the phrase "coupled to a semiconductor chip" may mean "coupled to integrated circuits in a semiconductor chip through chip pads of the semiconductor chip." The chip pads 315 of the first lower semiconductor chips 310 face the temporary substrate 900.

The second lower semiconductor chips 320 as shown are disposed within holes 290 and may be disposed laterally spaced apart from the first lower semiconductor chips 310. Each of the second lower semiconductor chips 320 may include integrated circuits (not shown) and chip pads 325 electrically connected to the integrated circuits. The integrated circuits may include transistors and may be memory circuits. The chip pads 325 may be exposed on bottom surfaces of the second lower semiconductor chips 320. The chip pads 325 may include metal, such as aluminum for example. The second lower semiconductor chips 320 may be different types of semiconductor chips than the first lower semiconductor chips 310. For example, each of the second lower semiconductor chips 320 may include a memory chip, such as a volatile memory chip, and may serve as a buffer memory device 4 described with respect to FIG. 1. The second lower semiconductor chips 320 may have different sizes and shapes than the first lower semiconductor chips 310.

The second lower semiconductor chips 320 may be provided identically to the first lower semiconductor chips 310. For example, the second lower semiconductor chips 320 may be provided on the temporary substrate 900, and chip pads 325 of the second lower semiconductor chips 320 face the temporary substrate 900. The first and second lower semiconductor chips 310 and 320 may be provided before or after the connection substrate 200 is placed on the temporary substrate 900.

A lower molding layer 410 is formed on the temporary substrate 900, covering the plurality of the first lower semiconductor chips 310, the plurality of the second lower semiconductor chips 320, and the connection substrate 200. For example, the lower molding layer 410 may cover top and side surfaces of the first lower semiconductor chips 310, top and side surfaces of the second lower semiconductor chips 320, and the top surface of the connection substrate 200. In some embodiments, different than as shown in FIG. 2B for example, the lower molding layer 410 may be formed to expose the top surfaces of the first lower semiconductor chips 310 and the top surfaces of the second lower semiconductor chips 320. In such a case, the lower molding layer 410 may fill gaps between the connection substrate 200 and the first lower semiconductor chips 310, gaps between the connection substrate 200 and the second lower semiconductor chips 320, and gaps between the first and second lower semiconductor chips 310 and 320 adjacent to each other. The lower molding layer 410 may include a dielectric polymer for example. The lower molding layer 410 may for example include an epoxy molding compound (EMC) or a photoimageable dielectric (PID) polymer.

Although not shown, a carrier adhesive layer may further be interposed between the temporary substrate 900 and the first lower semiconductor chips 310, between the temporary substrate 900 and the second lower semiconductor chips 320, and between the temporary substrate 900 and the connection substrate 200. The temporary substrate 900 is removed to expose the bottom surfaces of the first and second lower semiconductor chips 310 and 320 and the bottom surface 200b of the connection substrate 200. When the temporary substrate 900 is removed, the carrier adhesive layer may also be removed.

After the temporary substrate 900 is removed, referring to FIGS. 2A and 2D, a redistribution substrate 100 is formed on the exposed bottom surfaces of the first and second lower semiconductor chips 310 and 320, and on the exposed bottom surface 200b of the connection substrate 200. The formation of the redistribution substrate 100 may include forming first, second, and third dielectric layers 111, 112, and 113, forming a first redistribution pattern 131, and forming a second redistribution pattern 132. The formation of the redistribution substrate 100 will be further described hereinafter in detail.

Figure 3A:
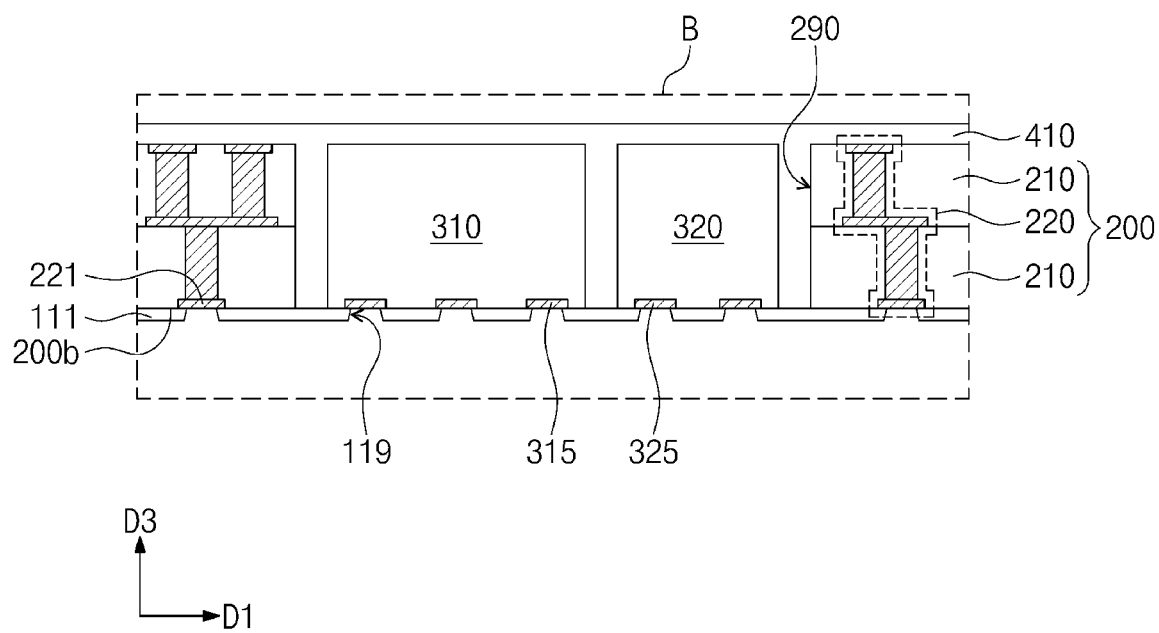
FIGS. 3A, 3B and 3C illustrate cross-sectional views showing a method of fabricating a redistribution substrate according to embodiments of the inventive concepts.
Figure 3B:
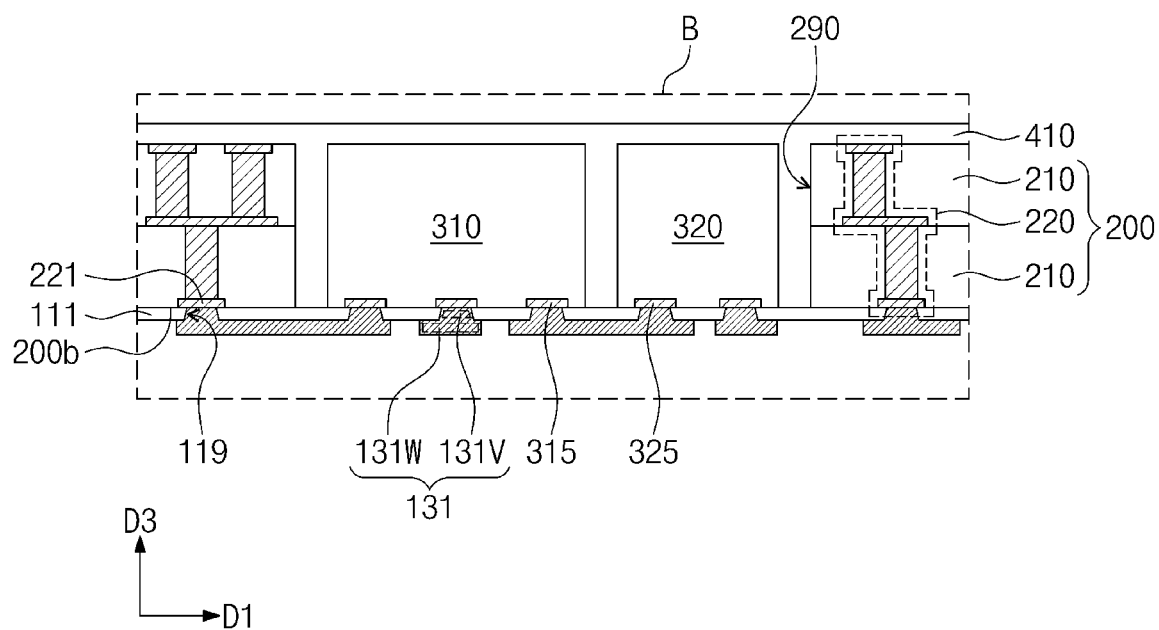
Figure 3C:
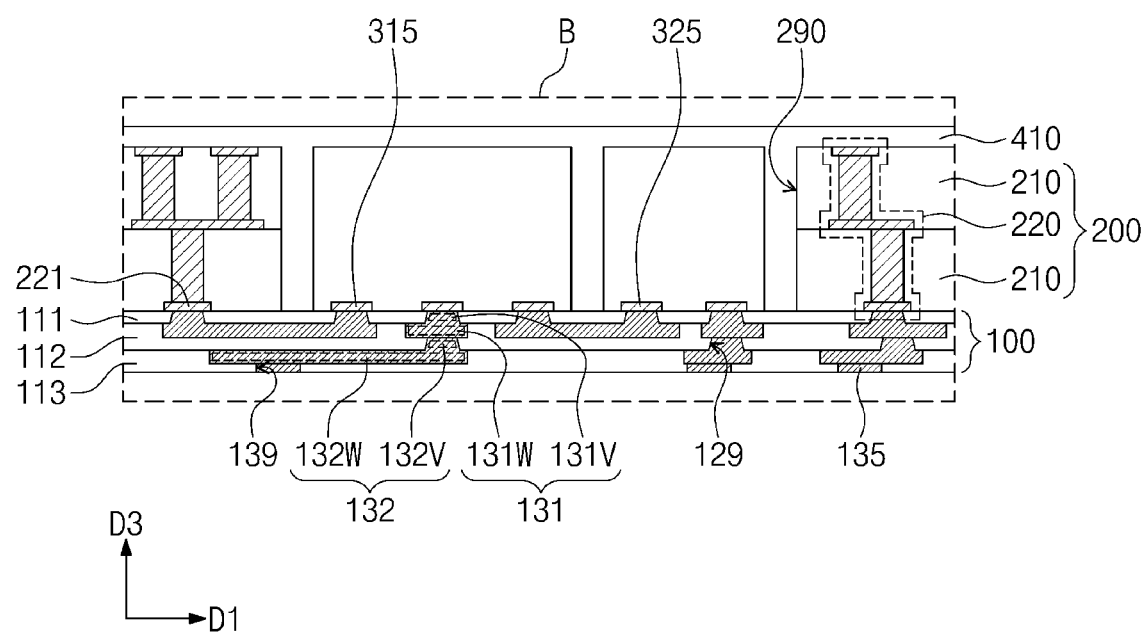

FIGS. 3A, 3B and 3C illustrate enlarged views of section B depicted in FIG. 2D, showing a method of fabricating a redistribution substrate according to embodiments of the inventive concepts. For brevity of explanation, with reference to FIGS. 3A to 3C, the following will describe an example including a single first lower semiconductor chip 310 and a single second lower semiconductor chip 320, although the redistribution substrate 100 may be fabricated in a panel level (i.e., along an entire panel). FIG. 2A will also be referred to in describing the embodiment with reference to FIGS. 3A to 3C.

Referring to FIGS. 2D and 3A, coating and patterning processes are performed to form a first dielectric layer 111 to cover the exposed bottom surface of the first lower semiconductor chip 310, the exposed bottom surface of the second lower semiconductor chip 320, and the exposed bottom surface 200b of the connection substrate 200. The first dielectric layer 111 may physically contact the bottom surface of the first lower semiconductor chip 310, the bottom surface of the second lower semiconductor chip 320, and the bottom surface 200b of the connection substrate 200. The first dielectric layer 111 may include, for example, a photoimageable dielectric (PID) polymer. The photoimageable dielectric polymer may include, for example, one or more of photosensitive solder resist, photosensitive polyimide, polybenzoxazole, phenolic polymer, and benzocyclobutene polymer. The first dielectric layer 111 is patterned to form first via holes 119 therein. The first dielectric layer 111 may be patterned by exposure and development processes. The first via holes 119 penetrate the first dielectric layer 111, and expose the chip pads 315 of the first lower semiconductor chip 310, the chip pads 325 of the second lower semiconductor chip 320, and the lower pads 221 of the connection substrate 200.

Referring to FIGS. 2D and 3B, first redistribution patterns 131 are formed on a bottom surface of the first dielectric layer 111 and in the first via holes 119. The formation of the first redistribution patterns 131 may include forming a seed pattern (not shown) in the first via holes 119 and on the bottom surface of the first dielectric layer 111, and then forming a conductive layer (not shown) by an electroplating process using the seed pattern. The seed pattern and the conductive layer may be patterned to form the first redistribution patterns 131. The first redistribution patterns 131 may include metal, such as copper. The first redistribution patterns 131 may include first via portions 131V and first line portions 131W. The first via portions 131V are provided in corresponding first via holes 119. The first via portions 131V are coupled to the chip pads 315 of the first lower semiconductor chips 310, the chip pads 325 of the second lower semiconductor chips 320, and the lower pads 221 of the connection substrate 200. The first line portions 131W are formed on the bottom surface of the first dielectric layer 111. The first line portions 131W are electrically connected to the first via portions 131V. The first line portions 131W and the first via portions 131V may be formed by a single process.

Referring to FIGS. 2D and 3C, a second dielectric layer 112, second redistribution patterns 132, a third dielectric layer 113, and conductive pads 135 are formed on the bottom surface of the first dielectric layer 111. A coating process may be performed on the bottom surface of the first dielectric layer 111, to form the second dielectric layer 112. The second dielectric layer 112 may cover the first redistribution patterns 131. The second dielectric layer 112 may include a photoimageable dielectric polymer. Exposure and development processes may be performed such that the second dielectric layer 112 may be patterned to form second via holes 129 therein. The second redistribution patterns 132 may be formed on a bottom surface of the second dielectric layer 112. The second redistribution patterns 132 may extend into the second via holes 129 of the second dielectric layer 112 and have electrical connection with the first redistribution patterns 131. The formation of the second redistribution patterns 132 may include forming a seed pattern in the second via holes 129 and on the bottom surface of the second dielectric layer 112, forming a conductive layer by an electroplating process using the seed pattern, and patterning the seed pattern and the conductive layer. The second redistribution patterns 132 may include second via portions 132V and second line portions 132W. The second via portions 132V are provided in the second via holes 129. The second line portions 132W are disposed on the bottom surface of the second dielectric layer 112 and coupled to at least one of the second via portions 132V. The second redistribution patterns 132 may include, but are not limited to, copper.

A coating process may be performed to form a third dielectric layer 113 on the bottom surface of the second dielectric layer 112, and thus the third dielectric layer 113 may cover the second redistribution patterns 132. The third dielectric layer 113 may include a photoimageable dielectric polymer. Exposure and development processes may be performed such that the third dielectric layer 113 may be patterned to form pad holes 139 therein. The pad holes 139 may expose at least portions of bottom surfaces of the second redistribution patterns 132. The third dielectric layer 113 may serve as a passivation layer.

The conductive pads 135 are formed in the pad holes 139, covering the exposed bottom surfaces of the second redistribution patterns 132. The conductive pads 135 may be electrically connected through the second redistribution patterns 132 to the first redistribution patterns 131. At least one of the conductive pads 135 may not be aligned in the third direction D3 with the first via portion 131V of the first redistribution pattern 131 connected to the at least one conductive pad 135. The conductive pads 135 may include metal, such as copper and/or aluminum. The redistribution substrate 100 may therefore be fabricated through the processes described above. The redistribution substrate 100 may include the first, second, and third dielectric layers 111, 112, and 113, the first and second redistribution patterns 131 and 132, and the conductive pads 135.

The redistribution substrate 100 may electrically connect the lower semiconductor chips 310 and 320 to the connection substrate 200. In this description, the phrase "electrically connected to the redistribution substrate 100" may mean "electrically connected to at least one of the redistribution patterns 131 and 132." For example, at least one of the chip pads 315 of the first lower semiconductor chip 310 may be electrically connected through the redistribution substrate 100 to at least one of the chip pads 325 of the second lower semiconductor chip 320. At least one of the chip pads 315 of the first lower semiconductor chip 310 may be electrically connected through the redistribution substrate 100 to at least one of the lower pads 221 of the connection substrate 200. At least one of the chip pads 325 of the second lower semiconductor chip 320 may be electrically connected through the redistribution substrate 100 to at least one of the lower pads 221 of the connection substrate 200.

The number of the dielectric layers 111, 112, and 113 and the number of the redistribution patterns 131 and 132 may be variously changed. For example, the redistribution substrate 100 may further include third redistribution patterns and a fourth dielectric layer between the third dielectric layer 113 and the conductive pads 135. As another example, neither the second redistribution patterns 132 nor the second dielectric layer 112 may be formed. As shown in FIG. 2D, the redistribution substrate 100 may be formed in a panel level.

Referring to FIGS. 2A and 2E, openings 409 may be formed in the lower molding layer 410, correspondingly exposing the upper pads 224 of the connection substrate 200. For example, the upper pads 224 may include a metal layer and a passivation layer that are stacked, and the passivation layer may include nickel (Ni) and/or gold (Au). The passivation layer may be a multiple layer. The passivation layer may prevent corrosion of the upper pads 224. The aforementioned processes may eventually fabricate a panel package P1. The panel package P1 may be a package fabricated in a panel level. The panel package P1 may include a plurality of strip packages P2 connected to each other. The strip packages P2 may be defined by first sawing lines SL1. In this description, the first sawing lines SL1 may be imaginary lines or virtual lines. The panel package P1 may correspond to a first preliminary package used for the fabrication of semiconductor packages PKG1 which will be described hereinafter.

Referring to FIGS. 2F and 2G, a first sawing process may be performed on the panel package P1. The first sawing process may include sawing the lower molding layer 410, the connection substrate 200 and the redistribution substrate 100 to form separated redistribution substrates 100, separated lower molding layers 410, and separated connection substrates 200. In the end, the strip packages P2 may be separated from each other. Each of the strip packages P2 may include a corresponding one of the separated redistribution substrates 100, at least two corresponding ones of the first lower semiconductor chips 310, at least two corresponding ones of the second lower semiconductor chips 320, a corresponding one of the separated connection substrates 200, and a corresponding one of the separated lower molding layers 410. For example, each of the strip packages P2 may include a sawed portion of the redistribution substrate 100, at least two of the first lower semiconductor chips 310 and the second lower semiconductor chips 320, and a sawed portion of the connection substrate 200. Each of the strip packages P2 may correspond to a second preliminary package used for the fabrication of semiconductor packages PKG1 which will be described hereinafter. For brevity, a single strip package P2 will be illustrated and described hereinafter.

Figure 4A:
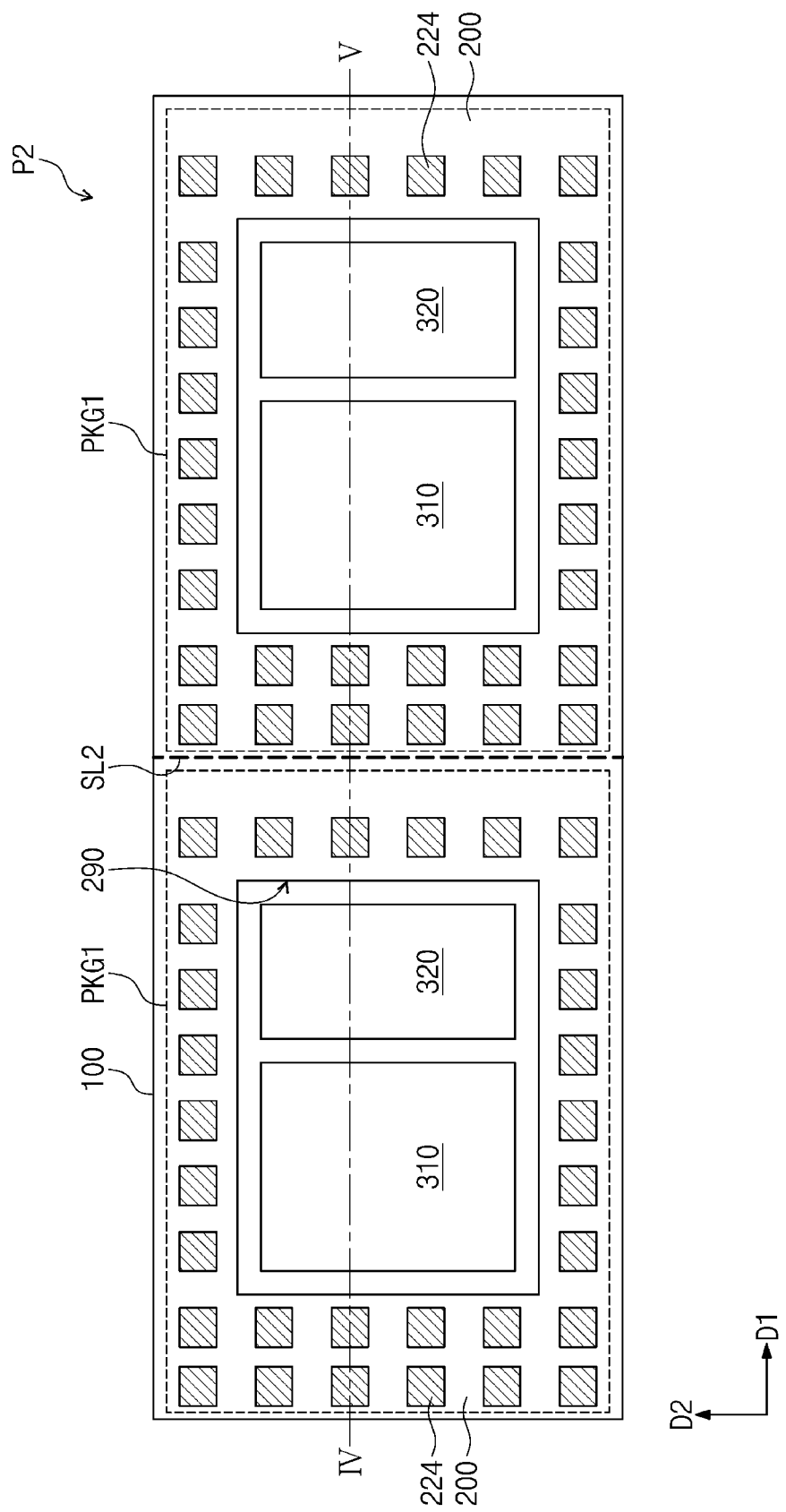
FIG. 4A illustrates a plan view showing a strip package according to embodiments of the inventive concepts.
Figure 4B:
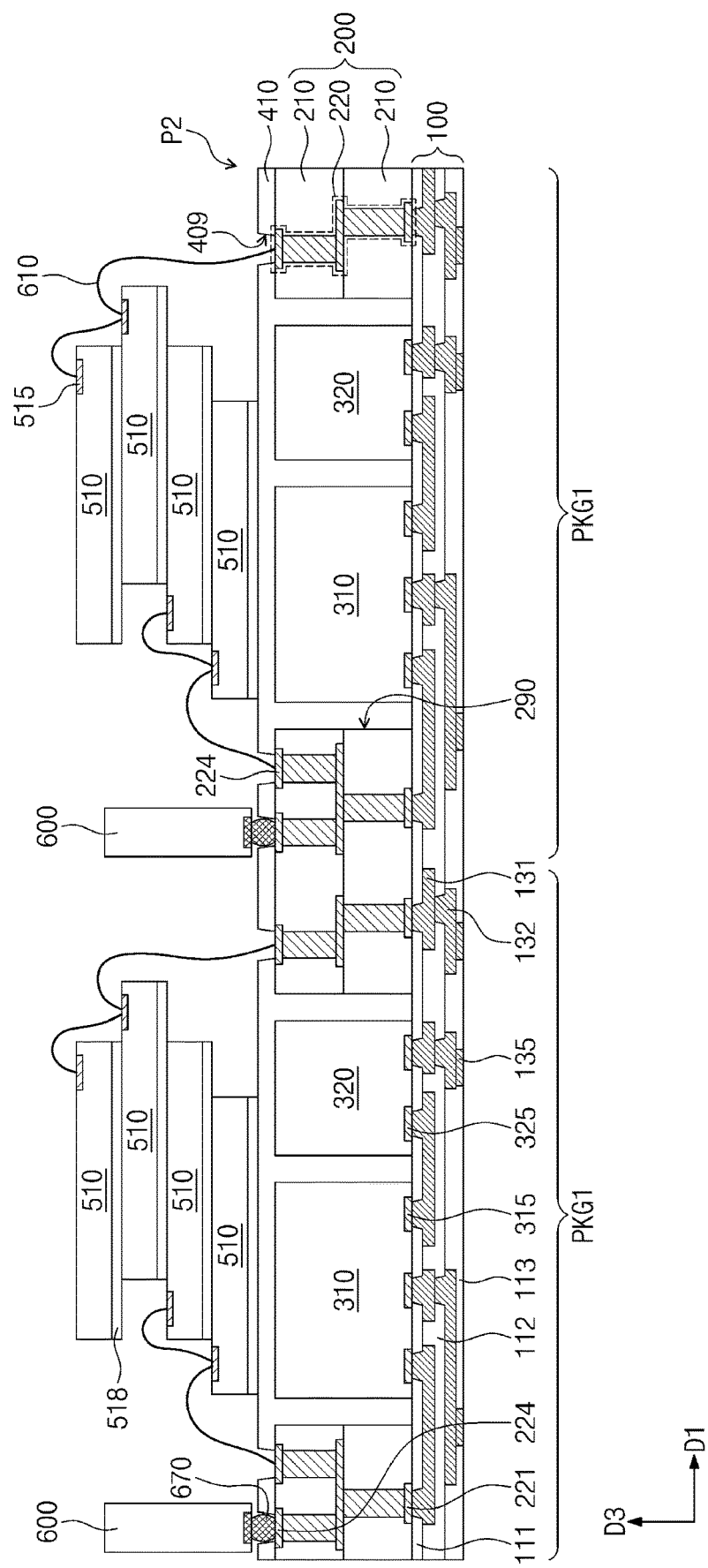
FIGS. 4B and 4C illustrate cross-sectional views taken along line IV-V of FIG. 4A showing a method of fabricating a semiconductor package according to embodiments of the inventive concepts.
Figure 4C:
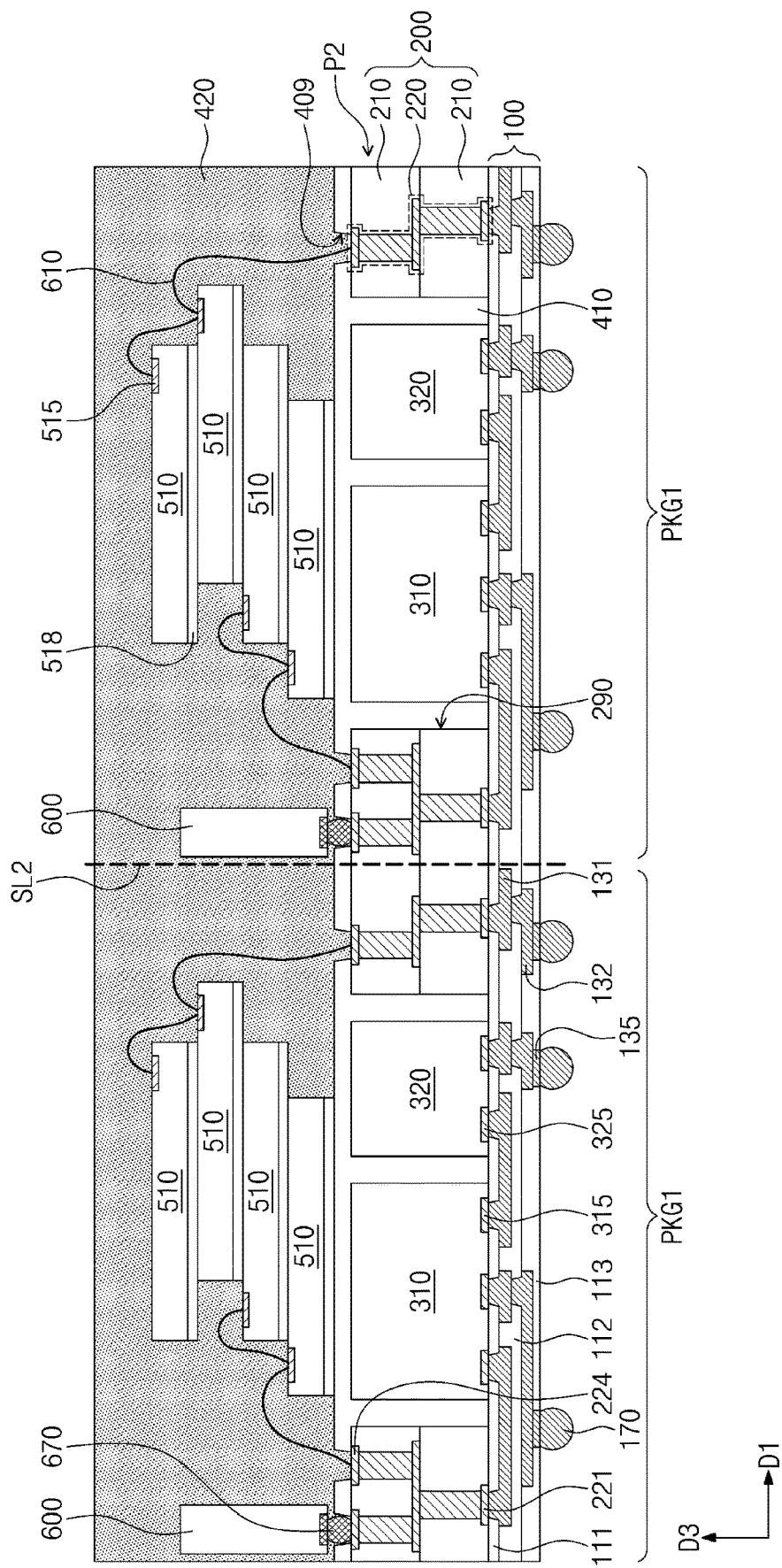
Figure 4E:
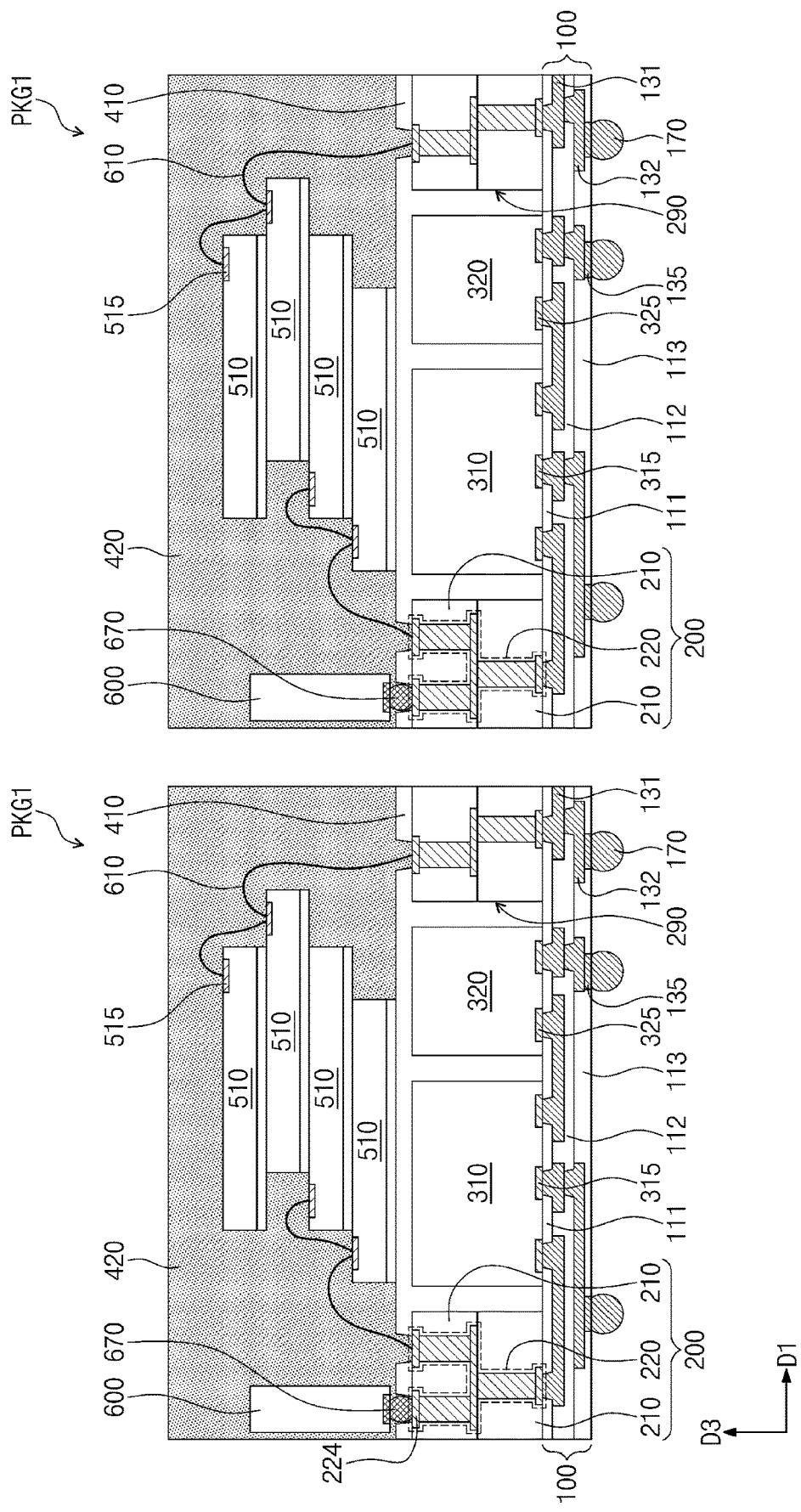
FIG. 4E illustrates a cross-sectional view taken along line IV'-V' of FIG. 4D.

FIG. 4A illustrates a plan view showing a strip package according to some embodiments of the inventive concepts. FIGS. 4B and 4C illustrate cross-sectional views taken along line IV-V of FIG. 4A, showing a method of fabricating a semiconductor package according to embodiments of the inventive concepts. FIG. 4D illustrates a plan view showing separated semiconductor packages according to embodiments of the inventive concepts. FIG. 4E illustrates a cross-sectional view taken along line IV'-V' of FIG. 4D.

Referring to FIGS. 4A and 4B, first upper semiconductor chips 510 are provided on the strip package P2 shown in FIG. 4A. That is, FIG. 4A shows the strip package P2 prior to fabrication into a semiconductor package. For example, the first upper semiconductor chips 510 may be provided on the lower molding layer 410. At least two of the first upper semiconductor chips 510 may be disposed spaced apart from each other. The at least two first upper semiconductor chips 510 may vertically overlap a corresponding first lower semiconductor chip 310 or a corresponding second lower semiconductor chip 320. In certain embodiments, the first upper semiconductor chips 510 may be stacked to form chip stacks. The chip stacks may be disposed laterally spaced apart from each other. Each of the chip stacks may include a plurality of the first upper semiconductor chips 510 and vertically overlap the holes 290 of the connection substrate 200. Each of the first upper semiconductor chips 510 may serve as the memory device 3 described with respect to FIG. 1. For example, the first upper semiconductor chips 510 may include nonvolatile memory chips, such as NAND Flash memory chips. The first upper semiconductor chips 510 may be the same type semiconductor chip configured to perform the same function. The first upper semiconductor chips 510 may have the same size and storage capacity, although embodiments of the inventive concepts are not limited to the first upper semiconductor chips 510 having the same size and storage capacity.

Adhesive patterns 518 may further be provided on bottom surfaces of the first upper semiconductor chips 510. For example, the adhesive patterns 518 may be provided between the first upper semiconductor chips 510, and between the lower molding layer 410 and a lowermost first upper semiconductor chip 510. The adhesive patterns 518 may include a dielectric polymer.

First connection terminals 610 are formed to have connection with the connection substrate 200 and corresponding first upper semiconductor chips 510. For example, each of the first connection terminals 610 may directly contact a corresponding upper pad 224 and one of chip pads 515 of the first upper semiconductor chips 510. Therefore, the first upper semiconductor chips 510 may be coupled through the conductive structure 220 and the redistribution substrate 100 to the first lower semiconductor chips 310 or the second lower semiconductor chips 320. The first connection terminals 610 may include bonding wires. The first connection terminals 610 may include metal, such as gold.

Passive devices 600 may be provided on the connection substrate 200. The passive devices 600 are disposed spaced apart from the first upper semiconductor chips 510. The passive devices 600 may be coupled to the conductive structure 220 through conductive connectors 670. The conductive connectors 670 are formed between the upper pads 224 and the passive devices 600 and may include solder balls, bumps, or pillars. The conductive connectors 670 may directly contact the upper pads 224. When viewed in plan, the upper pads 224 connected to the conductive connectors 670 are spaced apart from the upper pads 224 connected to the first connection terminals 610. As another example, the conductive connectors 670 may include bonding wires and may be provided on top surfaces of the passive devices 600. The passive devices 600 may be coupled through the conductive connectors 670 to the conductive structure 220 and the redistribution substrate 100. Thus, the passive devices 600 may be electrically connected to the first lower semiconductor chips 310, the second lower semiconductor chips 320, or the first upper semiconductor chips 510. The passive devices 600 may for example include one or more of an inductor, a capacitor, and a resistor. As another example, in embodiments of the inventive concepts passive devices 600 are not provided.

Referring to FIGS. 4A and 4C, an upper molding layer 420 is formed on the strip package P2 to cover the first upper semiconductor chips 510. For example, the upper molding layer 420 may be provided on the lower molding layer 410 to encapsulate the first upper semiconductor chips 510 and the first connection terminals 610. The upper molding layer 420 may cover the passive devices 600. The upper molding layer 420 may include a dielectric polymer, such as an epoxy-based molding compound.

Through the processes above, the strip package P2 may be converted into a plurality of semiconductor packages PKG1 in (or at) a strip level. The semiconductor packages PKG1 may be connected to each other. The semiconductor packages PKG1 may be defined by second sawing lines SL2. In this description, the second sawing lines SL2 may be imaginary lines or virtual lines.

In certain embodiments, the upper molding layer 420 may directly physically contact the lower molding layer 410. The first connection terminals 610 may directly contact the chip pads 515 of the first upper semiconductor chips 510 and the upper pads 224. Neither a package substrate, nor a redistribution layer, nor a gap is provided between the lower molding layer 410 and the first upper semiconductor chips 510. A gap as here mentioned may indicate or be a hollow space occupied by air or like. The semiconductor package PKG1 may thus be compact-sized. For example, the semiconductor package PKG1 may have decreased height.

External terminals 170 may be formed on a bottom surface of the redistribution substrate 100. The external terminals 170 may be formed on corresponding exposed bottom surfaces of the conductive pads 135. Certain ones of the external terminals 170 may be electrically connected through the redistribution patterns 131 and 132 to the first and second lower semiconductor chips 310 and 320. Other ones of the external terminals 170 may be electrically connected to the first upper semiconductor chips 510 through the redistribution patterns 131 and 132 and the conductive structure 220. The external terminals 170 may include a conductive material, such as metal. The external terminals 170 may include one or more of a solder ball, a pillar, and a bump. The semiconductor packages PKG1 may be fan-out semiconductor packages. For example, at least one of the external terminals 170 of each semiconductor package PKG1 may not overlap, in the third direction D3, the first and second lower semiconductor chips 310 and 320. The at least one external terminal 170 may overlap the connection substrate 200, when viewed in plan.

Referring to FIGS. 4D and 4E, a second sawing process may be performed on the strip package P2 and the upper molding layer 420. It should be understood that FIG. 4D shows a plan view of the semiconductor packages PKG1 without depiction of the upper molding layer 420, the first upper semiconductor chips 510, the passive device 600, the first connection terminals 610 and the conductive connectors 670 so as to simplify the drawings. In the second sawing process, for example, the upper molding layer 420, the lower molding layer 410, the connection substrate 200, and the redistribution substrate 100 may be sawed along the second sawing lines SL2, with the result that packages may be separated from each other. The packages may be the semiconductor packages PKG1. Each semiconductor package PKG1 may include sawed components, for example, the redistribution substrate 100, the lower molding layer 410, the connection substrate 200, the upper molding layer 420, the passive device 600, the first lower semiconductor chip 310, the second lower semiconductor chip 320, and the first upper semiconductor chips 510. Differently from that shown in FIG. 4E, in some embodiments of the inventive concepts the semiconductor packages PKG1 do not include passive device 600.

In certain embodiments, the fabrication of the semiconductor packages PKG1 is simplified because the first upper semiconductor chips 510, the first connection terminals 610, and the upper molding layer 420 are provided/formed in a strip level and then the second sawing process separates the semiconductor packages PKG1, as shown in FIGS. 4A to 4C.

The following will describe in detail the formation of the openings 409 in the lower molding layer 410.

Figure 5A:
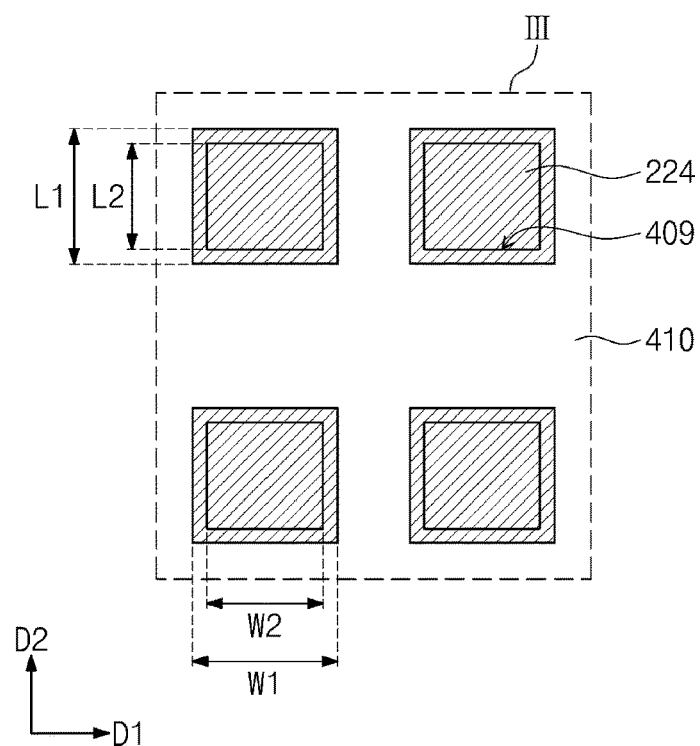
FIGS. 5A, 5B and 5C illustrate plan views showing openings according to embodiments of the inventive concepts.

FIG. 5A illustrates an enlarged plan view of section III depicted in FIG. 2A, showing openings according to embodiments of the inventive concepts.

Referring to FIGS. 2A, 2E, and 5A, the openings 409 may be formed by a drilling process, for example a laser drilling process. A laser beam may pattern the lower molding layer 410 such that the openings 409 may be sequentially formed through the lower molding layer 410. The openings 409 expose corresponding upper pads 224 of the connection substrate 200. However, if the base layers (see 210 of FIG. 2E) of the connection substrate 200 are exposed to the laser beam, the base layers 210 may be damaged.

Accordingly, in embodiments of the inventive concepts each of the openings 409 may have planar area less than the planar area of corresponding one of the upper pads 224, so that the base layers 210 are not exposed within the openings 409. That is, in FIG. 5A the upper pads 224 are exposed by (through) openings 409, so that outer peripheral areas of the upper pads 224 are disposed so as to be covered by the lower molding layer 410. For example, in the embodiments of the inventive concepts each of the openings 409 has width W2 equal to or less than width W1 of corresponding one of the upper pads 224. Each of the openings 409 has length L2 equal to or less than length L1 of corresponding one of the upper pads 224. In this case, the width of a certain component indicates a maximum distance in the first direction D1 of the certain component, and the length of the certain component denotes a distance in the second direction D2 of the certain component.

Figure 5B:
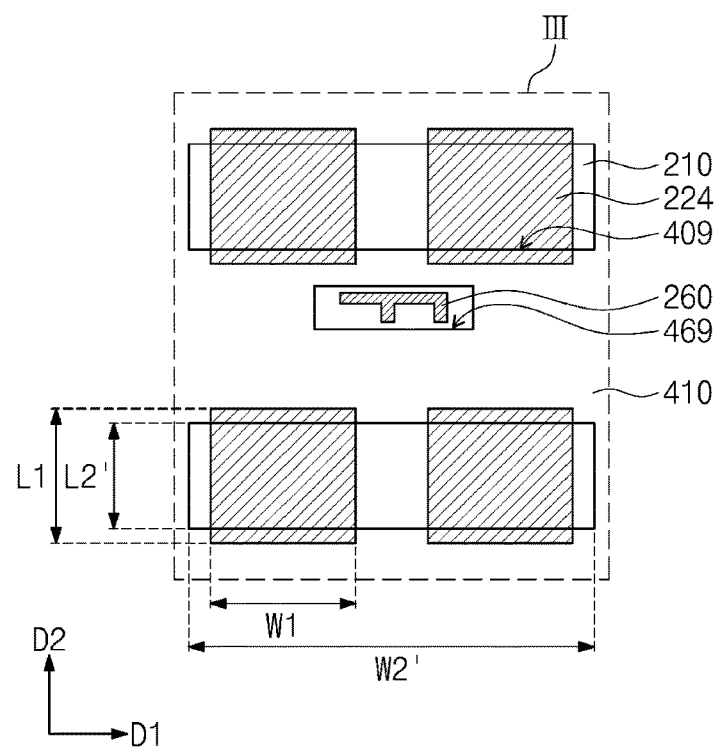
Figure 5C:
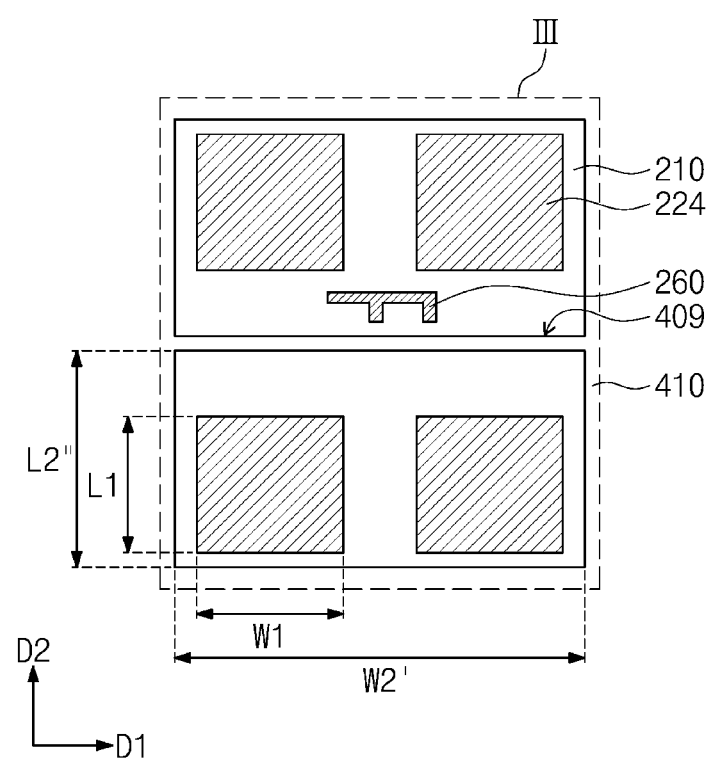
Figure 5D:
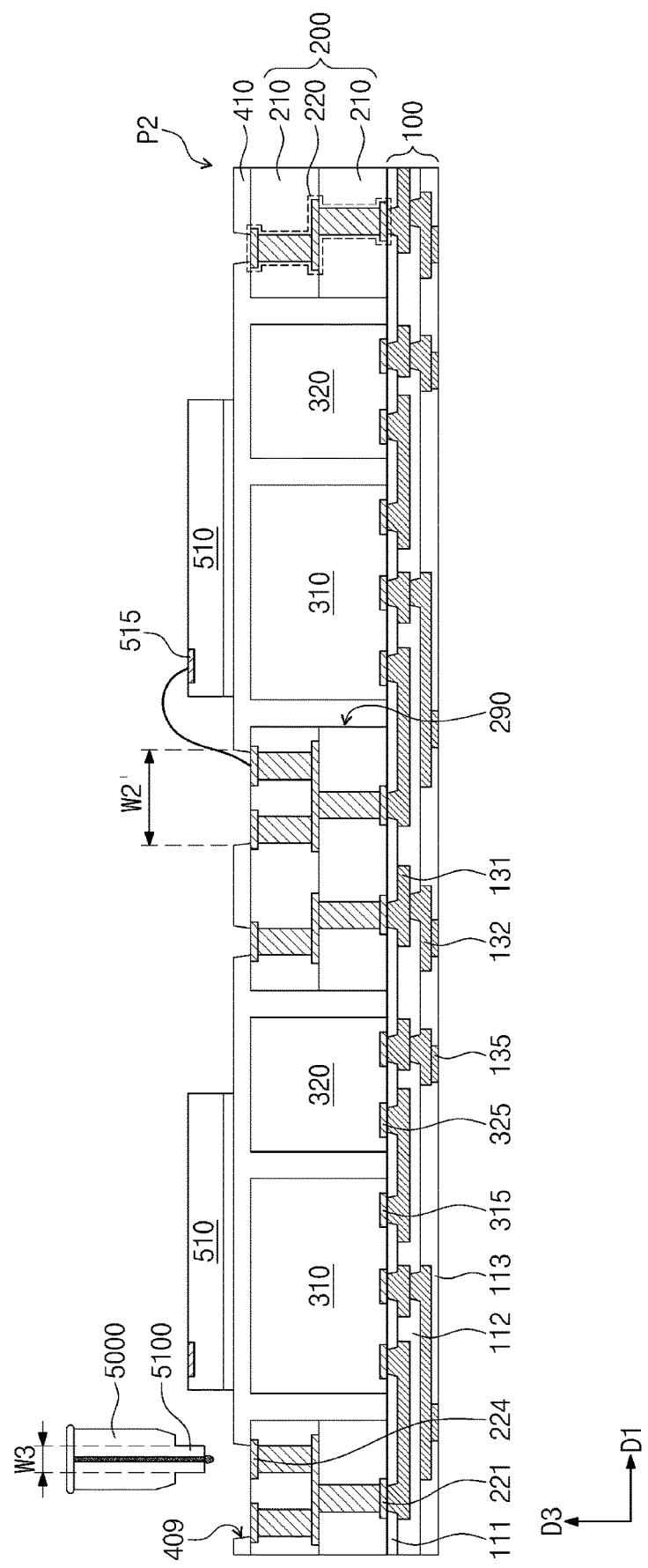
FIG. 5D illustrates a cross-sectional view showing a method of fabricating first connection terminals according to embodiments of the inventive concepts.

FIG. 5B illustrates an enlarged plan view of section III depicted in FIG. 2A, showing openings according to other embodiments of the inventive concepts. FIG. 5C illustrates an enlarged plan of section III depicted in FIG. 2A, showing openings according to still further embodiments of the inventive concepts. FIG. 5D illustrates a cross-sectional view taken along line IV-V of FIG. 4A, showing a method of fabricating first connection terminals (e.g., 610) according to embodiments of the inventive concepts.

Referring to FIGS. 2E, 5B, and 5C, the openings 409 may be formed by a photolithography process that patterns the lower molding layer 410. In this case, the lower molding layer 410 may include a photoimageable dielectric polymer. The photoimageable dielectric polymer may include, for example, one or more of photosensitive solder resist, photosensitive polyimide, polybenzoxazole, phenolic polymer, and benzocyclobutene polymer. For example, the lower molding layer 410 may include the same material as that of at least one of the dielectric layers 111, 112, and 113 of the redistribution substrate 100, but the inventive concepts are not limited thereto.

Exposure and development processes may be performed to pattern the lower molding layer 410. The exposure process may include providing a photomask on the lower molding layer 410 and irradiating light on portions of the lower molding layer 410 that are exposed by the photomask. The development process may include using a development solution to remove one of exposed and non-exposed portions of the lower molding layer 410, and to leave the other of exposed and non-exposed portions of the lower molding layer 410. Thus, the openings 409 may be formed in the lower molding layer 410. In certain embodiments, because the openings 409 are formed by exposure and development processes (in contrast to a laser drilling process for example), damage to the base layers 210 may be avoided even though the openings 409 expose the uppermost base layer (see 210 of FIG. 2E). Accordingly, the size and planar shape of the openings 409 may be freely designed. For example, one of the openings 409 may expose a top surface of the uppermost base layer 210 and a plurality of the upper pads 224. The one of the openings 409 as shown in FIG. 5B has a width W2' equal to or greater than the width W1 of the upper pad 224. As also shown in FIG. 5B, the opening 409 may have a length L2' less than the length L1 of the upper pad 224. Alternatively, in a further embodiment of the inventive concepts as shown in FIG. 5C, the opening 409 may have a length L2" equal to or greater than the length L1 of the upper pad 224. Although not particularly shown, a plurality of the openings 409 may have the same or different shapes. The width W1, the length L1, and a pitch of each upper pad 224 may thus be freely designed without being restricted by the size and arrangement of the opening 409. Thus, an area required for arrangement of the upper pads 224 may be reduced to scale down a semiconductor package. In certain embodiments, the upper pads 224 may be formed to have relatively small size and fine pitch.

Moreover, because the lower molding layer 410 is patterned by exposure and development processes, a plurality of the openings 409 may be formed by a single process. For example, the openings 409 may be formed substantially at the same time. As a result, it may be possible to reduce the time required for the formation of the openings 409 and to simplify the fabrication of a semiconductor package.

An alignment key 260 may be further provided on the top surface of the uppermost base layer 210. The alignment key 260 may provide information about positions where the first upper semiconductor chips 510 are to be disposed when the first upper semiconductor chips 510 are placed as shown in FIGS. 4B and 5D. Alternatively, the alignment key 260 may provide information about positions where the upper pads 224 are disposed when the first connection terminals 610 are formed as shown in FIGS. 4B and 5D. As in a still further alternative, the alignment key 260 may provide information about positions of the passive devices 600 when being placed as shown in FIG. 4B. For example, the alignment key 260 and the upper pads 224 may be formed by a single process, and the alignment key 260 may have substantially the same thickness as that of the upper pads 224. The alignment key 260 may include a conductive material, such as metal. The alignment key 260 may have a shape different than that of the upper pads 224. The alignment key 260 may have a planar area different than that of the upper pads 224.

In certain embodiments, as shown in FIG. 5B, when the lower molding layer 410 is patterned, an alignment opening 469 may further be formed in the lower molding layer 410 and may expose the alignment key 260. The alignment opening 469 may have a planar shape different than that of the openings 409. In certain embodiments, because the lower molding layer 410 is patterned by a photolithography process, even though the alignment opening 469 has a different shape than that of the openings 409, the alignment opening 469 and the openings 409 may be formed by a single process.

Also, because the alignment opening 469 is formed by a photolithography process, damage of the uppermost base layer 210 may be avoided even when the uppermost base layer 210 is exposed. The alignment opening 469 may expose the alignment key 260 and may also expose the uppermost base layer 210. The alignment opening 469 may thus have a planar shape different from that of the alignment key 260. In certain embodiments, although the alignment key 260 has a relatively complicated shape, the alignment opening 469 may be freely formed without being restricted by the shape of the alignment key 260. Therefore, the formation of the alignment opening 469 may be simplified.

As shown in FIG. 5C, one of the openings 409 may expose the upper pads 224 and the alignment key 260. In this case, the formation of the alignment opening 469 may be omitted. A planar arrangement of the alignment key 260 may be variously changed, and the formation of the alignment opening 469 and the planar shape of the openings 409 may be adjusted based on arrangement and process convenience of the alignment key 260.

FIG. 5D illustrates a cross-sectional view taken along line IV-V of FIG. 4A, showing a method of fabricating first connection terminals according to embodiments of the inventive concepts. For brevity of explanation, with reference to FIG. 5D, the following will describe an example including a single opening and a single first upper semiconductor chip.

Referring to FIGS. 5B, 5C, and 5D, a bonding-wire apparatus 5000 is utilized to form the first connection terminals 610. The bonding-wire apparatus 5000 includes a tip 5100. The tip 5100 includes a capillary that discharges conductive material. The bonding-wire apparatus 5000 may be driven or manipulated so that the tip 5100 may for example contact the chip pads 515 of the first upper semiconductor chips 510 and the upper pads 224 sequentially, to thus form the first connection terminals 610. The first connection terminals 610 may be bonding wires. However, if the width W2' of the opening 409 is less than a width W3 of the tip 5100, or if the length L2' or L2" of the opening 409 is less than a length of the tip 5100, the first connection terminals 610 may not satisfactorily contact the upper pads 224. On the other hand, if the tip 5100 physically contacts the lower molding layer 410, the tip 5100 and/or the lower molding layer 410 may be damaged. In certain embodiments of the inventive concepts, the width W2' of the opening 409 is greater than the width W3 of the tip 5100, and/or the length L2' or L2" of the opening 409 is greater than the length of the tip 5100. Consequently, in embodiments of the inventive concepts the first connection terminals 610 may be satisfactorily formed, and damage to the lower molding layer 410 and/or the tip 5100 may be prevented while the first connection terminals 610 are formed.

In order to simplify the drawings, in figures other than FIGS. 5B to 5D, the openings 409 are illustrated as exposing corresponding upper pads 224. However, at least one of the openings 409 in figures other than FIGS. 5B to 5D may expose at least two of the upper pads 224.

Figure 6A:
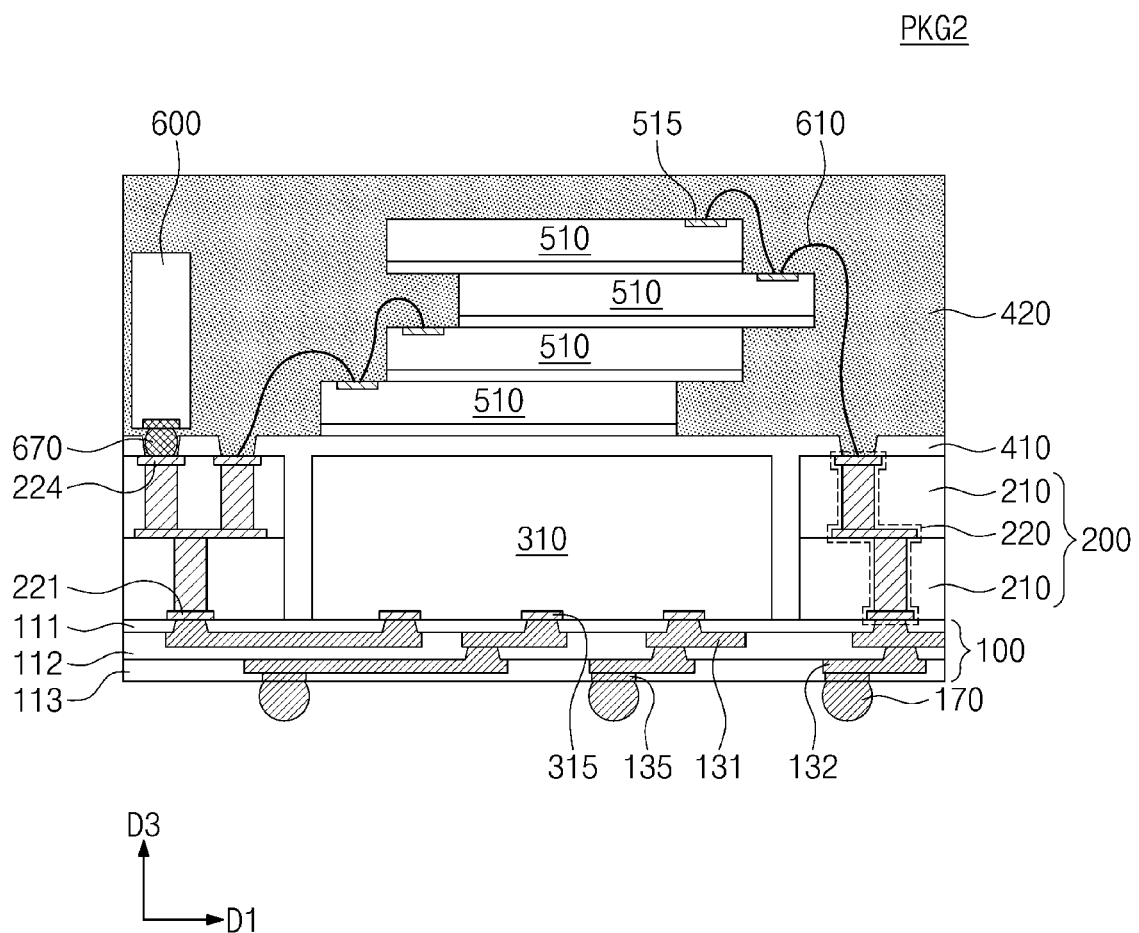
FIGS. 6A, 6B and 6C illustrate cross-sectional views showing semiconductor packages according to embodiments of the inventive concepts.

FIG. 6A illustrates a cross-sectional view showing a semiconductor package according to embodiments of the inventive concepts. With reference to FIGS. 6A to 6I, the following will describe an example including a single hole.

Referring to FIG. 6A, a semiconductor package PKG2 may be fabricated by substantially the same method as that described with reference to FIGS. 2A to 4E. That is, the semiconductor package PKG2 in FIG. 6A may be substantially the same as the semiconductor package PKG1 shown in FIG. 4E for example, except that the semiconductor package PKG2 of FIG. 6A does not include a second lower semiconductor chip 320. For the sake of brevity, aspects of fabrication and configuration of the semiconductor package PKG2 that are similar to that of semiconductor package PKG1 are omitted.

Figure 6B:
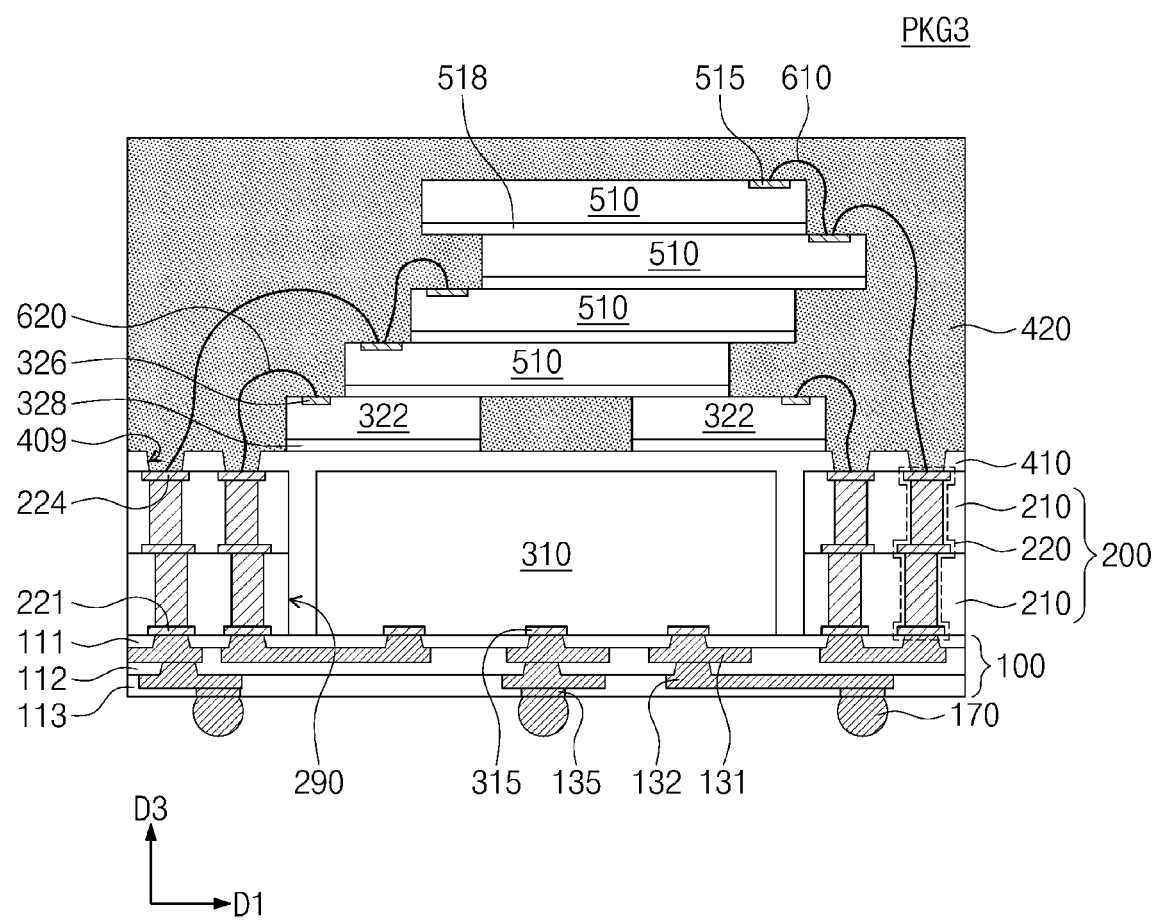

FIG. 6B illustrates a cross-sectional view showing a semiconductor package according to embodiments of the inventive concepts.

Referring to FIG. 6B, a semiconductor package PKG3 includes a redistribution substrate 100, a first lower semiconductor chip 310, a connection substrate 200, a lower molding layer 410, first connection terminals 610, an upper molding layer 420, and upper semiconductor chips 510 and 322. In contrast to the embodiment as described with respect to FIG. 4E, the second lower semiconductor chip 320 is not provided in hole 290 of the connection substrate 200 in FIG. 6B.

The upper semiconductor chips 510 and 322 include a first upper semiconductor chip 510 and a second upper semiconductor chip 322. The first upper semiconductor chip 510 may be the volatile memory device 3 described with respect to FIG. 1. The first upper semiconductor chip 510 may be substantially the same as that described with respect to FIGS. 4A to 4E. For example, the first upper semiconductor chip 510 may include a plurality of first upper semiconductor chips 510 that are stacked. The first connection terminals 610 directly contact chip pads 515 of the first upper semiconductor chips 510 and upper pads 224. The first upper semiconductor chips 510 may be correspondingly coupled through the first connection terminals 610 to the upper pads 224 of the connection substrate 200. Adhesive patterns 518 may be provided on bottom surfaces of the first upper semiconductor chips 510. A lowermost one of the first upper semiconductor chips 510 is spaced apart in a third direction D3 from the lower molding layer 410.

The second upper semiconductor chip 322 is interposed between the lower molding layer 410 and the lowermost first upper semiconductor chip 510. The second upper semiconductor chip 322 may be provided as a plurality of second upper semiconductor chips 322. The plurality of second upper semiconductor chips 322 may be disposed laterally spaced apart from each other. The second upper semiconductor chips 322 may have the same size and shape. Second connection terminals 620 are provided as connected between chip pads 326 on the top surfaces of the second upper semiconductor chips 322 and corresponding upper pads 224. Thus, the second upper semiconductor chips 322 may be electrically connected through a conductive structure 220 to the first upper semiconductor chips 510, the first lower semiconductor chip 310, or external terminals 170. The second connection terminals 620 may be bonding wires. The upper pads 224 connected to the second upper semiconductor chips 322 may be spaced apart from the upper pads 224 connected to the first upper semiconductor chips 510.

In certain embodiments, the chip pads 326 of the second upper semiconductor chips 322 may be provided on a bottom surface of the second upper semiconductor chips 322, and the second connection terminals 620 may be interposed between the bottom surface of the second upper semiconductor chip 322 and the upper pads 224. In this case, the second connection terminals 620 may include solder balls, bumps, or pillars instead of bonding wires.

The second upper semiconductor chips 322 may be of different type than the first upper semiconductor chips 510. For example, each of the second upper semiconductor chips 322 may include a volatile memory chip, such as DRAM, and serve as a buffer memory device 4 described with respect to FIG. 1. The second upper semiconductor chips 322 may have different sizes and shapes than those of the first upper semiconductor chips 510. The second upper semiconductor chips 322 are provided or disposed before the first upper semiconductor chips 510. Adhesive layers 328 may further be interposed between the second upper semiconductor chips 322 and the lower molding layer 410. The adhesive layers 328 may include a dielectric polymer.

The upper molding layer 420 is formed on the lower molding layer 410, covering the first upper semiconductor chips 510 and the second upper semiconductor chips 322. The upper molding layer 420 may directly contact the lower molding layer 410. The upper molding layer 420 may encapsulate the first and second connection terminals 610 and 620.

In certain embodiments, if it is difficult to provide semiconductor chips such as the second upper semiconductor chips 322 in the holes 290 of the connection substrate 200, the semiconductor chips such as the second upper semiconductor chips 322 may be provided on the lower molding layer 410. As a result, the fabrication of the semiconductor package PKG3 is simplified.

Figure 6C:
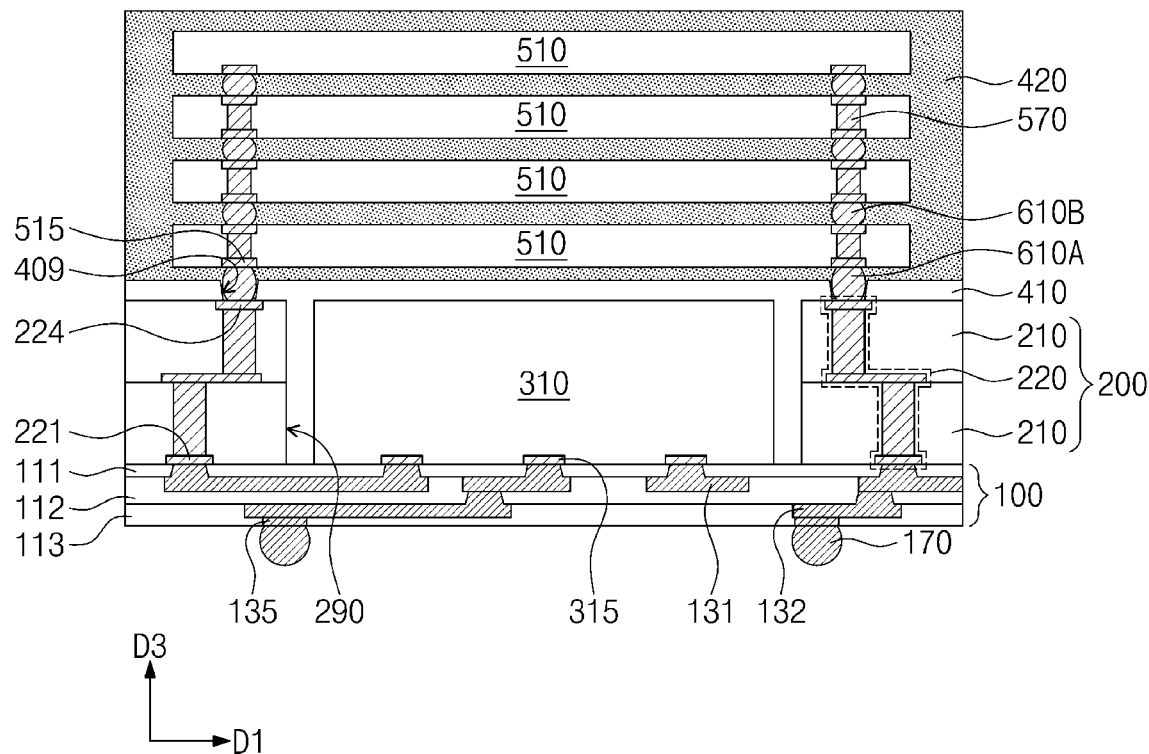

FIG. 6C illustrates a cross-sectional view showing a semiconductor package according to embodiments of the inventive concepts.

Referring to FIG. 6C, a semiconductor package PKG4 includes a redistribution substrate 100, a first lower semiconductor chip 310, a connection substrate 200, a lower molding layer 410, first upper semiconductor chips 510, connection terminals 610A and 610B, and an upper molding layer 420. The semiconductor package PKG4 may be fabricated by substantially the same method as that described with respect to FIGS. 2A to 4E. The first upper semiconductor chips 510 may be stacked to form a chip stack. For the sake of brevity, aspects of fabrication and configuration of the semiconductor package PKG4 that are similar to that of semiconductor package PKG1 are omitted.

The first upper semiconductor chip 510 has chip pads 515 on a bottom surface thereof. The first upper semiconductor chips 510 have through vias 570 penetrating therethrough. The through vias 570 are electrically connected to internal integrated circuits and chip pads 515 of corresponding first upper semiconductor chips 510.

The connection terminals 610A and 610B include lower connection terminals 610A and upper connection terminals 610B. The lower connection terminals 610A are provided between a lowermost first upper semiconductor chip 510 and the connection substrate 200, and are directly coupled to upper pads 224 and the chip pads 515 of the lowermost first upper semiconductor chip 510. The upper connection terminals 610B are provided between two neighboring first upper semiconductor chips 510 and are electrically connected to the first upper semiconductor chips 510. The first upper semiconductor chips 510 on the lowermost first upper semiconductor chip 510 are electrically connected to the upper pads 224 through the upper connection terminals 610B, the through vias 570, and the lower connection terminals 610A. Each of the lower and upper connection terminals 610A and 610B may include a solder ball, a bump, or a pillar. The lower and upper connection terminals 610A and 610B may include a conductive material, such as metal. An uppermost one of the first upper semiconductor chips 510 as shown in FIG. 6C does not include a through via, but the inventive concepts are not limited thereto and in other embodiments the uppermost one of the first upper semiconductor chips 510 may include a through via.

In figures other than FIG. 6C, the first connection terminals 610 may be changed into the lower and upper connection terminals 610A and 610B as shown in FIG. 6C. In such cases, the first upper semiconductor chips 510 may have the through vias 570.

Figure 6D:
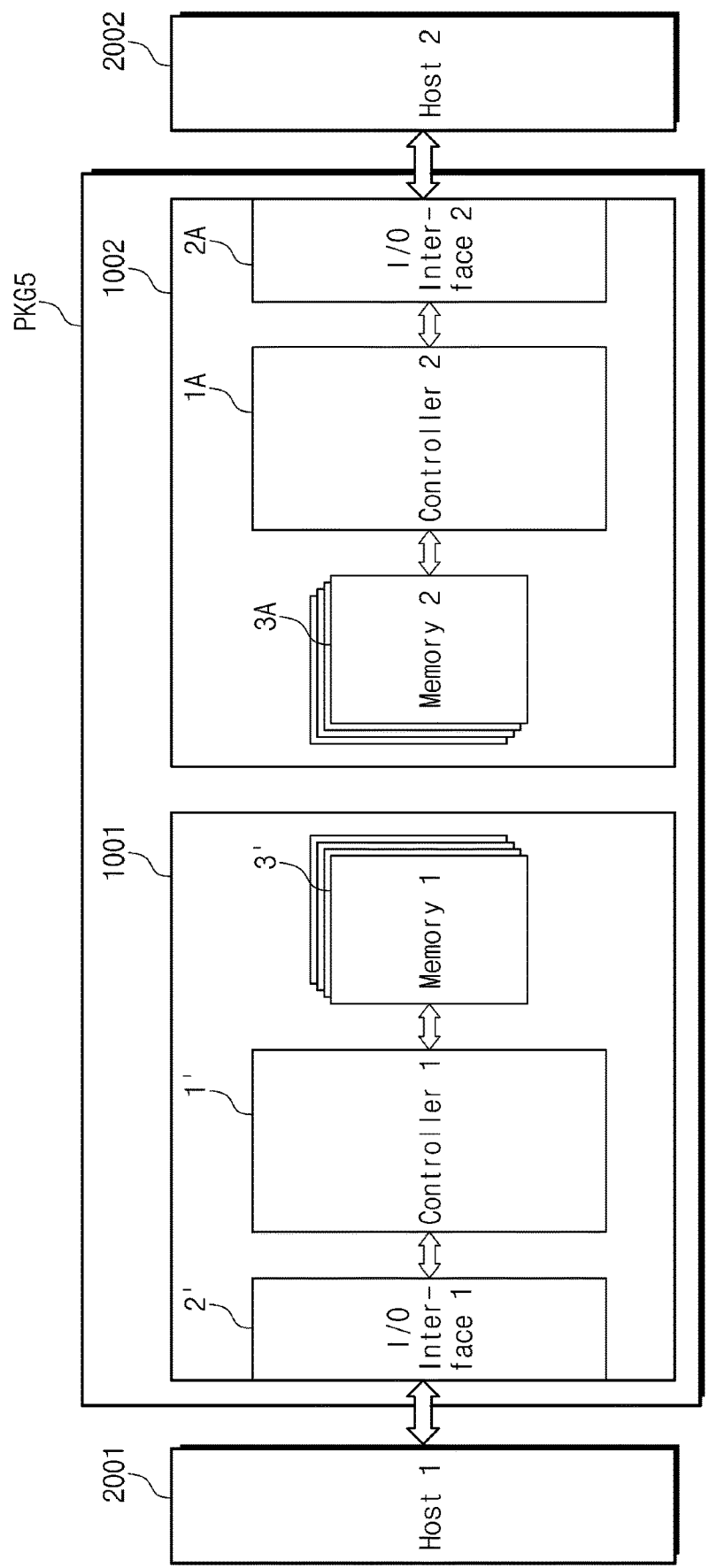
FIG. 6D illustrates a simplified block diagram showing a semiconductor package according to embodiments of the inventive concepts.
Figure 6E:
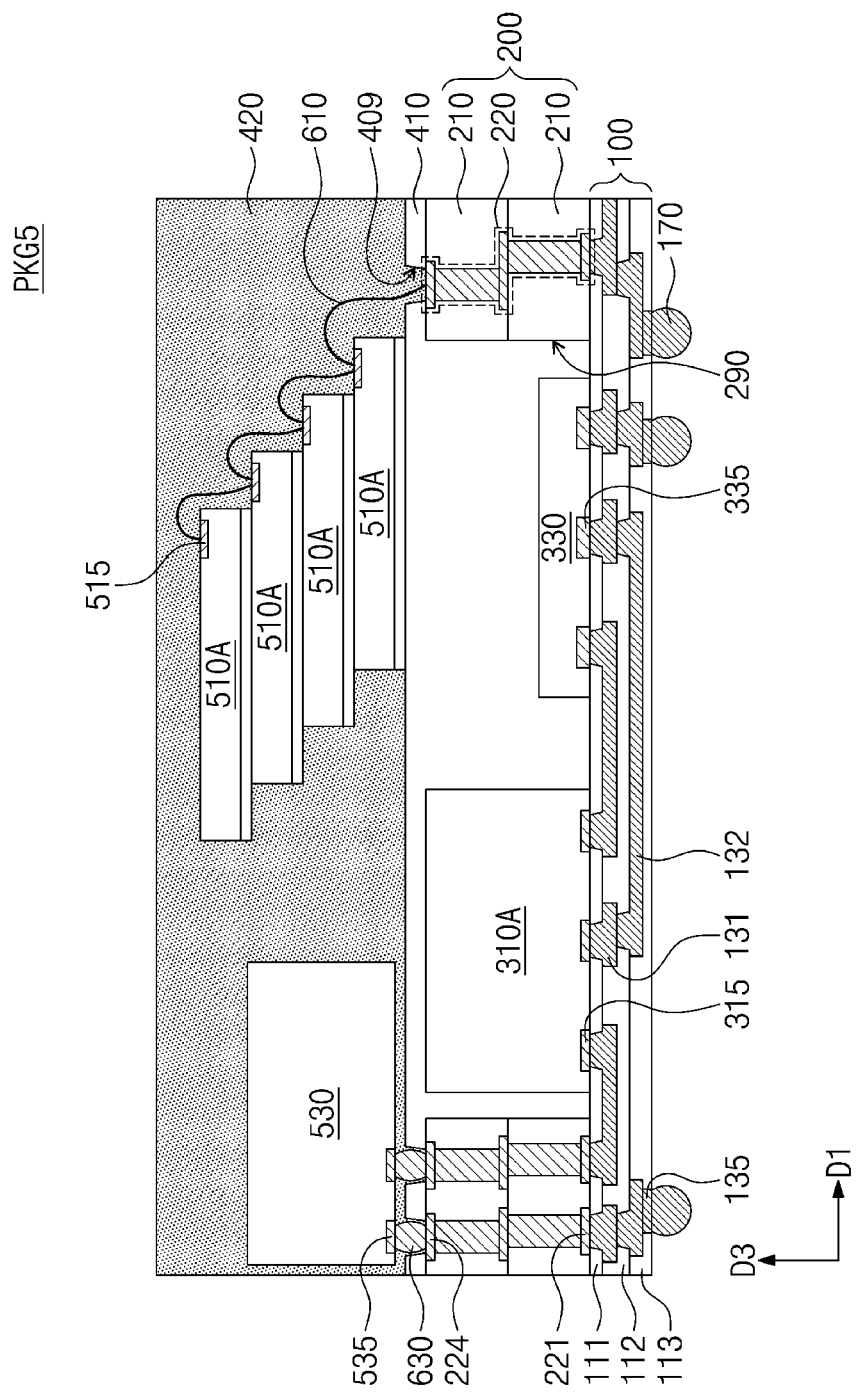
FIGS. 6E, 6F, 6G, 6H and 6I illustrate cross-sectional views showing semiconductor packages according to embodiments of the inventive concepts.

FIG. 6D illustrates a simplified electrical connection of a semiconductor package according to embodiments of the inventive concepts. FIG. 6E illustrates a cross-sectional view showing a semiconductor package according to embodiments of the inventive concepts.

Referring to FIG. 6D, a semiconductor package (e.g., PKG5 of FIG. 6E) includes a first package 1001 and a second package 1002. The first package 1001 may be substantially the same as the solid state drive package 1000 described previously with respect to FIG. 1. The first package 1001 may store or read data in response to read/write requests from a first host (Host 1) 2001. The first host 2001 may be an external electronic device. The first package 1001 includes a first controller (Controller 1) 1', a first input/output interface ((I/O Interface 1) 2', a first memory device (Memory 1) 3', and a first buffer memory device (not shown). The first controller 1', the first input/output interface 2', the first memory device 3', and the first buffer memory device may respectively be substantially the same as the controller 1, the input/output interface 2, the memory device 3, and the buffer memory device 4 that are described with respect to FIG. 1. The first package 1001 may include first upper semiconductor chips 510A and a third upper semiconductor chip 530 shown in FIG. 6E or 6F which will be described hereinafter.

The second package 1002 may be a data base storage package. The second package 1002 may store or read data in response to read/write requests from a second host (Host 2) 2002. The second host 2002 may be an external electronic device. The second host 2002 may be different from the first host 2001. For example, the second package 1002 may be configured to perform separately from the first package 1001. The second package 1002 includes a second input/output interface (I/O Interface 2) 2A, a second controller (Controller 2) 1A, and a second memory device (Memory 2) 3A. The second controller 1A may communicate signals with the second host 2002 through the second input/output interface 2A. The signals between the second controller 1A and the second host 2002 may include commands, addresses, data, and so on. In response to the command from the second host 2002, the second controller 1A may write data in or read data from the second memory device 3A.

The second input/output interface 2A may provide a physical connection between the second host 2002 and the second package 1002. For example, in response to a bus format of the second host 2002, the second input/output interface 2A may interface with the second package 1002. The bus format of the second host 2002 may include for example USB, PCI express, SATA, PATA, or the like.

The second memory device 3A may be a nonvolatile memory device. The second memory device 3A may be NAND Flash memory having large capacity and high-speed storage capability. In certain embodiments, the second memory device 3A may be for example phase change random access memory (PRAM), magnetic random access memory (MRAM), resistive random access memory (Re-RAM), ferromagnetic random access memory (FRAM), NOR Flash memory, or the like. The second package 1002 may include a first lower semiconductor chip 310A and a third lower semiconductor chip 330 shown in FIG. 6E or 6F which will be described hereinafter.

Referring to FIG. 6E, a semiconductor package PKG5 includes a redistribution substrate 100, lower semiconductor chips 310A and 330, a connection substrate 200, a lower molding layer 410, upper semiconductor chips 510A and 530, first and third connection terminals 610 and 630, and an upper molding layer 420.

The upper semiconductor chips 510A and 530 may include first upper semiconductor chip 510A and a third upper semiconductor chip 530. The upper semiconductor chips 510A and 530 may be devices of the first package 1001 shown in FIG. 6D. For example, each of the first upper semiconductor chips 510A may serve as the first memory device 3' of FIG. 6D and include a nonvolatile memory chip, such as a NAND Flash memory chip. The third upper semiconductor chip 530 may serve as the first controller 1' of FIG. 6D and include a logic chip.

The arrangement, the manner of providing, and electrical connection of the first upper semiconductor chips 510A may be substantially the same as those of the first upper semiconductor chips 510 described with respect to FIG. 4B. The first upper semiconductor chips 510A may be electrically connected to the redistribution substrate 100 through the first connection terminals 610 and the connection substrate 200.

The third upper semiconductor chip 530 may be disposed laterally spaced apart from the first upper semiconductor chips 510A. The third upper semiconductor chip 530 may be of different type than the first upper semiconductor chips 510A. The third connection terminals 630 are provided between the third upper semiconductor chip 530 and the connection substrate 200. The third connection terminals 630 may include solder balls, pillars, or bumps. The third connection terminals 630 may directly contact chip pads 535 of the third upper semiconductor chip 530 and upper pads 224. The upper pads 224 connected to the third connection terminals 630 are spaced apart and electrically separated from the upper pads 224 connected to the first connection terminals 610. The third upper semiconductor chip 530 may be electrically connected through the connection substrate 200 and the redistribution substrate 100 to the first upper semiconductor chip 510A and external terminals 170. The third upper semiconductor chip 530 may also be electrically connected through the redistribution substrate 100 to one of the lower semiconductor chips 310A and 330.

The lower semiconductor chips 310A and 330 may include a first lower semiconductor chip 310A and a third lower semiconductor chip 330. The first lower semiconductor chip 310A may be mounted by substantially the same method as that used to mount the first lower semiconductor chips 310 described with respect to FIGS. 2B and 2C.

The third lower semiconductor chip 330 is provided in a hole 290 of the connection substrate 200. The third lower semiconductor chip 330 may be disposed laterally spaced apart from the first lower semiconductor chip 310A. The mounting of the third lower semiconductor chip 330 may be substantially the same as that of the second lower semiconductor chip 320 described with respect to FIGS. 2B and 2C. For example, the third lower semiconductor chips 330 may be provided on a temporary substrate 900 such as shown in FIGS. 2B and 2C, and chip pads 335 of the third lower semiconductor chips 330 may face the temporary substrate 900. Afterwards, the temporary substrate 900 may be removed to expose a bottom surface of the third lower semiconductor chip 330. The redistribution substrate 100 may be formed on the exposed bottom surface of the third lower semiconductor chip 330. However, the function and role of the third lower semiconductor chip 330 may be different than that of the second lower semiconductor chip 320 described with respect to FIGS. 2B and 2C.

The first lower semiconductor chip 310A and the third lower semiconductor chip 330 may be configured to include circuits that perform separately from the upper semiconductor chips 510A and 530. In certain embodiments, the first lower semiconductor chip 310A and the third lower semiconductor chip 330 may be devices of the second package 1002 shown in FIG. 6D. For example, the first lower semiconductor chip 310A may serve as the second controller 1A of the second package 1002 shown in FIG. 6D and include a logic chip. The third lower semiconductor chip 330 may serve as the second memory device 3A of the second package 1002 shown in FIG. 6D and may include a nonvolatile memory chip, such as a NAND Flash memory chip.

Referring together to FIGS. 6D and 6E, because the second package 1002 of FIG. 6D serves as a data base storage package, the second package 1002 may be required to operate at high speeds. In certain embodiments, the first lower semiconductor chip 310A may be coupled through the redistribution substrate 100 to the third lower semiconductor chip 330. Therefore, a reduced electrical path may be provided between the first lower semiconductor chip 310A and the third lower semiconductor chip 330. For example, a reduced electrical path may be made between the second controller 1A and the second memory device 3A. As a result, the second package 1002 has increased operating speed.

Because the second package 1002 includes a data base storage package, the second memory device 3A may have wide bandwidth. The wider the bandwidth of a memory device, the larger the number of input/output terminals in a related semiconductor chip. The number of input/output terminals in the second memory device 3A may be greater than that of input/output terminals in the first memory device 3'. The input/output terminals may correspond to chip pads. The number of the chip pads 335 in the third lower semiconductor chip 330 may be greater than that of chip pads 515 in the first upper semiconductor chips 510A.

The redistribution substrate 100 includes redistribution patterns 131 and 132 formed at a narrow pitch. Even though the third lower semiconductor chip 330 has a large number of the chip pads 335, the third lower semiconductor chip 330 may be satisfactorily electrically connected to the first lower semiconductor chip 310A, without an excessive increase in thickness of the redistribution substrate 100.

Figure 6F:
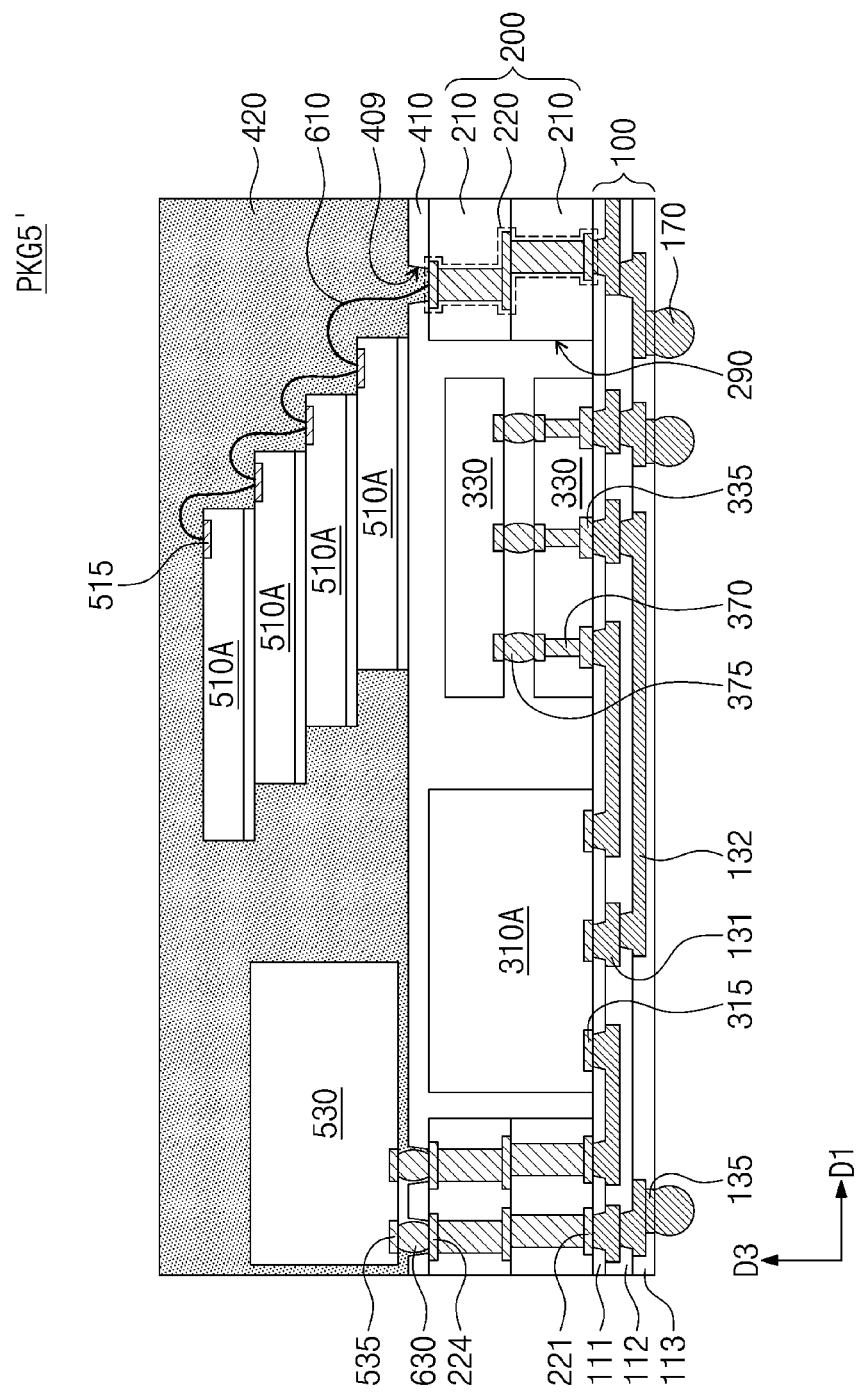

FIG. 6F illustrates a cross-sectional view showing a semiconductor package according to embodiments of the inventive concepts.

Referring to FIG. 6F, a semiconductor package PKG5' includes a redistribution substrate 100, lower semiconductor chips 310A and 330, a connection substrate 200, a lower molding layer 410, upper semiconductor chips 510A and 530, connection terminals 610 and 630, and an upper molding layer 420. The lower semiconductor chips 310A and 330 and the upper semiconductor chips 510A and 530 may be substantially the same as those described with respect to FIGS. 6D and 6E. For example, the third lower semiconductor chip 330 may serve as the second memory device 3A of the second package 1002 shown in FIG. 6D. In contrast to the embodiment described with respect to FIG. 6E, FIG. 6F includes a plurality of third lower semiconductor chips 330.

The third lower semiconductor chips 330 may be stacked to form a chip stack. A lowermost third lower semiconductor chip 330 includes chip pads 335 directly coupled to a first redistribution pattern 131. The third lower semiconductor chips 330 may have through vias 370. The through vias 370 may be electrically connected to internal integrated circuits and chip pads 335 of the corresponding third lower semiconductor chips 330. An uppermost third lower semiconductor chip 330 may not have through vias. Conductive terminals 375 are interposed between and electrically connected to the third lower semiconductor chips 330. The conductive terminals 375 may include solder balls, bumps, or pillars.

Figure 6G:
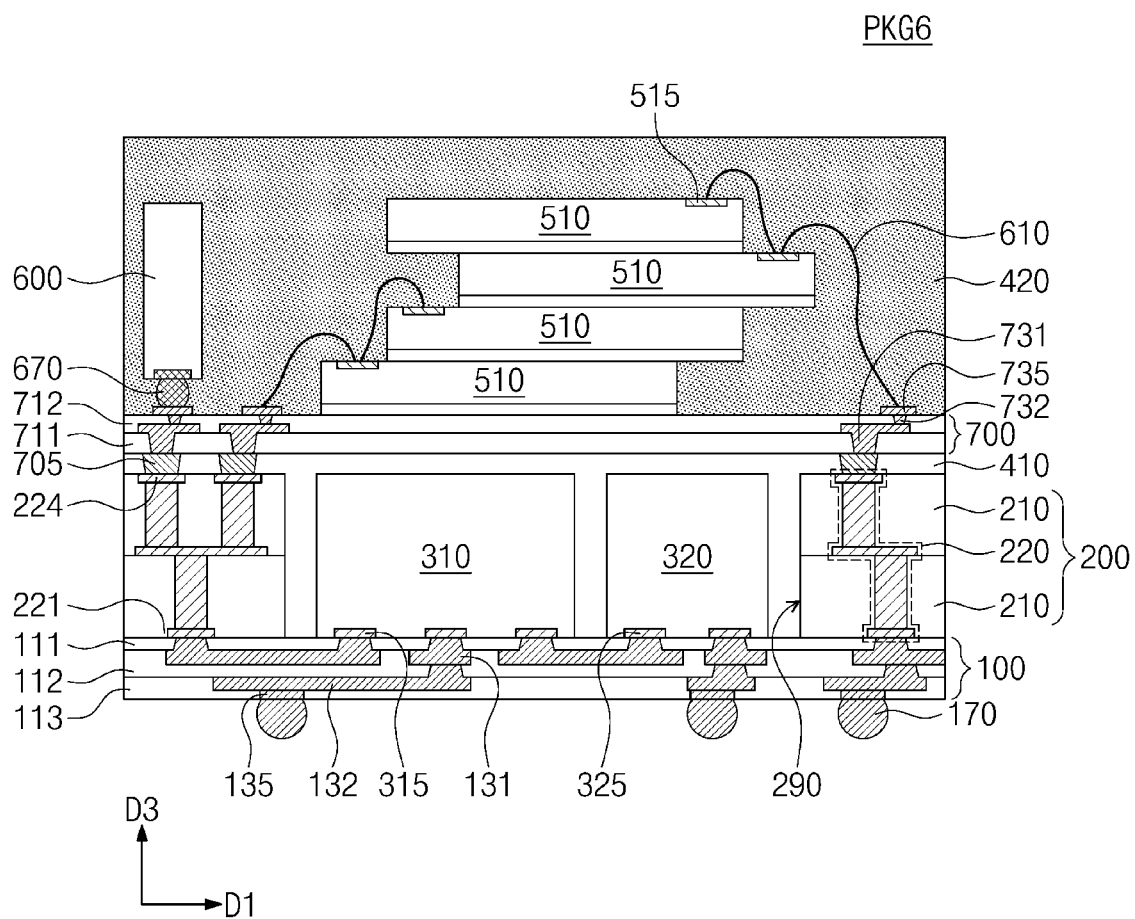

FIG. 6G illustrates a cross-sectional view showing a semiconductor package according to embodiments of the inventive concepts.

Referring to FIG. 6G, a semiconductor package PKG6 includes a redistribution substrate 100, lower semiconductor chips 310 and 320, a connection substrate 200, lower and upper molding layers 410 and 420, upper semiconductor chips 510, first connection terminals 610, and an upper redistribution layer 700.

The upper redistribution layer 700 is provided on a top surface of the lower molding layer 410. The upper redistribution layer 700 includes first and second upper dielectric layers 711 and 712, and first and second upper redistribution patterns 731 and 732.

After the openings 409 are formed as described with respect to FIG. 2E, conductive members 705 are formed in the openings 409. The first upper dielectric layer 711 is formed on the top surface of the lower molding layer 410. After that, the first upper redistribution patterns 731, the second upper dielectric layer 712, the second upper redistribution patterns 732, and upper conductive pads 735 are sequentially formed on the first upper dielectric layer 711. The first and second upper dielectric layers 711 and 712 may be formed by a method substantially the same as or similar to that used for the formation of the first, second, and third dielectric layers 111, 112, and 113 described previously. For example, each of the upper dielectric layers 711 and 712 may be formed by performing a coating process that coats a photoimageable dielectric polymer, and then performing on the coated photoimageable dielectric polymer a patterning process that includes exposure and development processes.

The first upper redistribution patterns 731 may be formed on a top surface of the first upper dielectric layer 711. The first upper redistribution patterns 731 may extend into the first upper dielectric layer 711 and have connection with the conductive members 705. The second upper redistribution pattern 732 is provided in the second upper dielectric layer 712. Differently from that shown in FIG. 6G, in some embodiments the second upper redistribution patterns 732 may further extend onto a top surface of the second upper dielectric layer 712. The upper conductive pads 735 may be provided on the second upper dielectric layer 712 and may be coupled to the second upper redistribution patterns 732. The first and second upper redistribution patterns 731 and 732 may be formed by a similar method to that used for the formation of the first and second redistribution patterns 131 and 132 described previously.

The number of the upper conductive pads 735 may be different than that of upper pads 224. The upper conductive pads 735 may be arranged differently from the upper pads 224. For example, one of the upper conductive pads 735 may not be aligned in a third direction D3 with the upper pad 224 electrically connected to the one of the upper conductive pads 735. The first connection terminals 610 and a conductive connector 670 may be correspondingly coupled to the upper conductive pads 735. In certain embodiments, because the upper redistribution layer 700 is provided, the degree of freedom of the arrangements of the first connection terminals 610 and the conductive connectors 670 may be increased. Accordingly, an increased degree of freedom of placement of a passive device 600 and the first upper semiconductor chips 510 may be realized. Both the number of the upper dielectric layers 711 and 712 and the number of the redistribution patterns 731 and 732 may be variously changed.

Figure 6H:
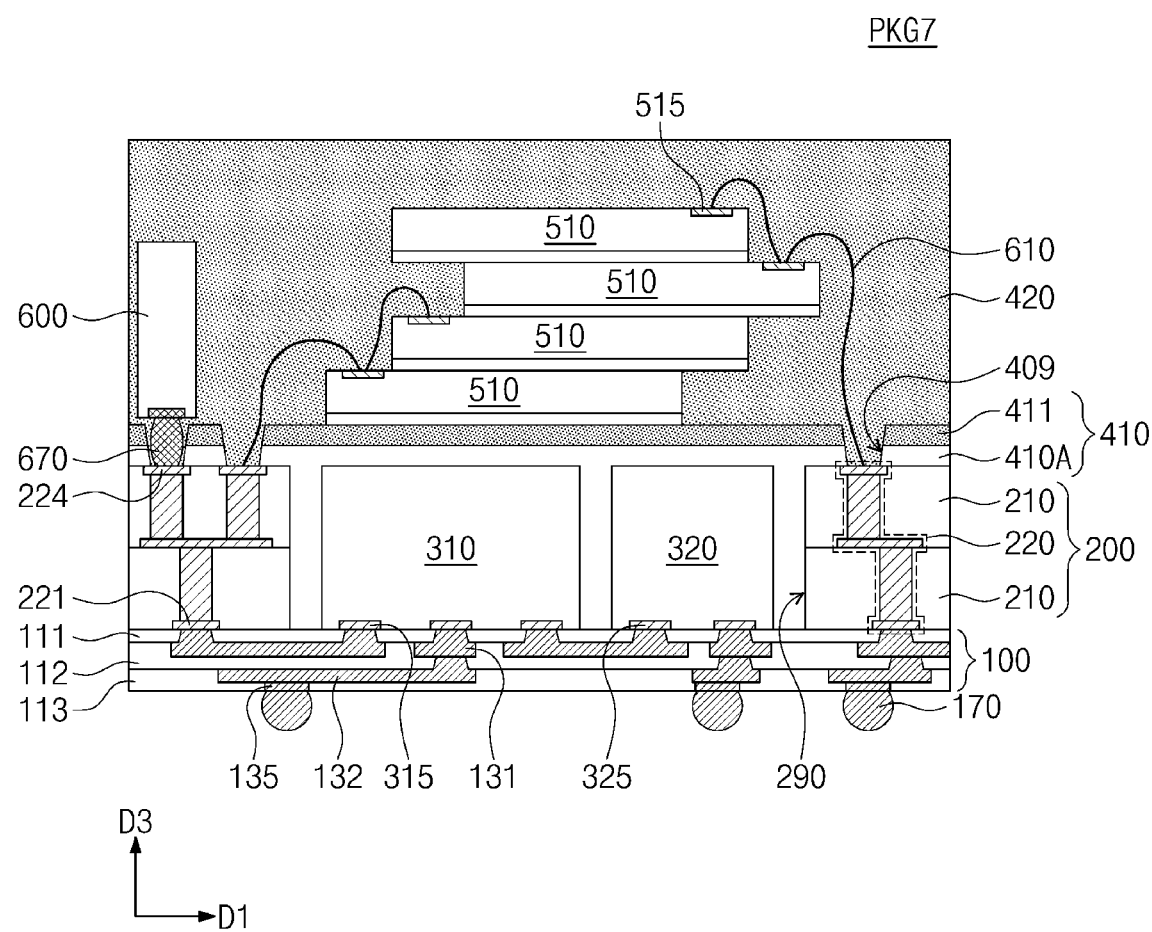

FIG. 6H illustrates a cross-sectional view showing a semiconductor package according to embodiments of the inventive concepts.

Referring to FIG. 6H, a semiconductor package PKG7 includes a redistribution substrate 100, first and second lower semiconductor chips 310 and 320, a connection substrate 200, a lower molding layer 410, first upper semiconductor chips 510, first connection terminals 610, and an upper molding layer 420.

The lower molding layer 410 includes a first lower molding layer 410A and a second lower molding layer 411. The first lower molding layer 410A may be substantially the same as the lower molding layer 410 of FIGS. 2A to 4E.

The second lower molding layer 411 may be formed on and may directly physically contact the first lower molding layer 410A. The second lower molding layer 411 may include a solder resist material. Openings 409 may penetrate the first lower molding layer 410A and the second lower molding layer 411. The openings 409 may be formed by a drilling process described with respect to FIGS. 2E and 5A, or a photolithography process described with respect to FIGS. 2E, 5B, and 5C.

The upper molding layer 420 may physically contact the second lower molding layer 411. Accordingly, no gap is provided between the first lower molding layer 410A and the second lower molding layer 411, and between the upper molding layer 420 and the second lower molding layer 411. Although the second lower molding layer 411 is not illustrated in figures other than FIG. 6H, a second lower molding layer such as second molding layer 411 may be included in the embodiments described with respect to figures other than FIG. 6H.

Figure 6I:
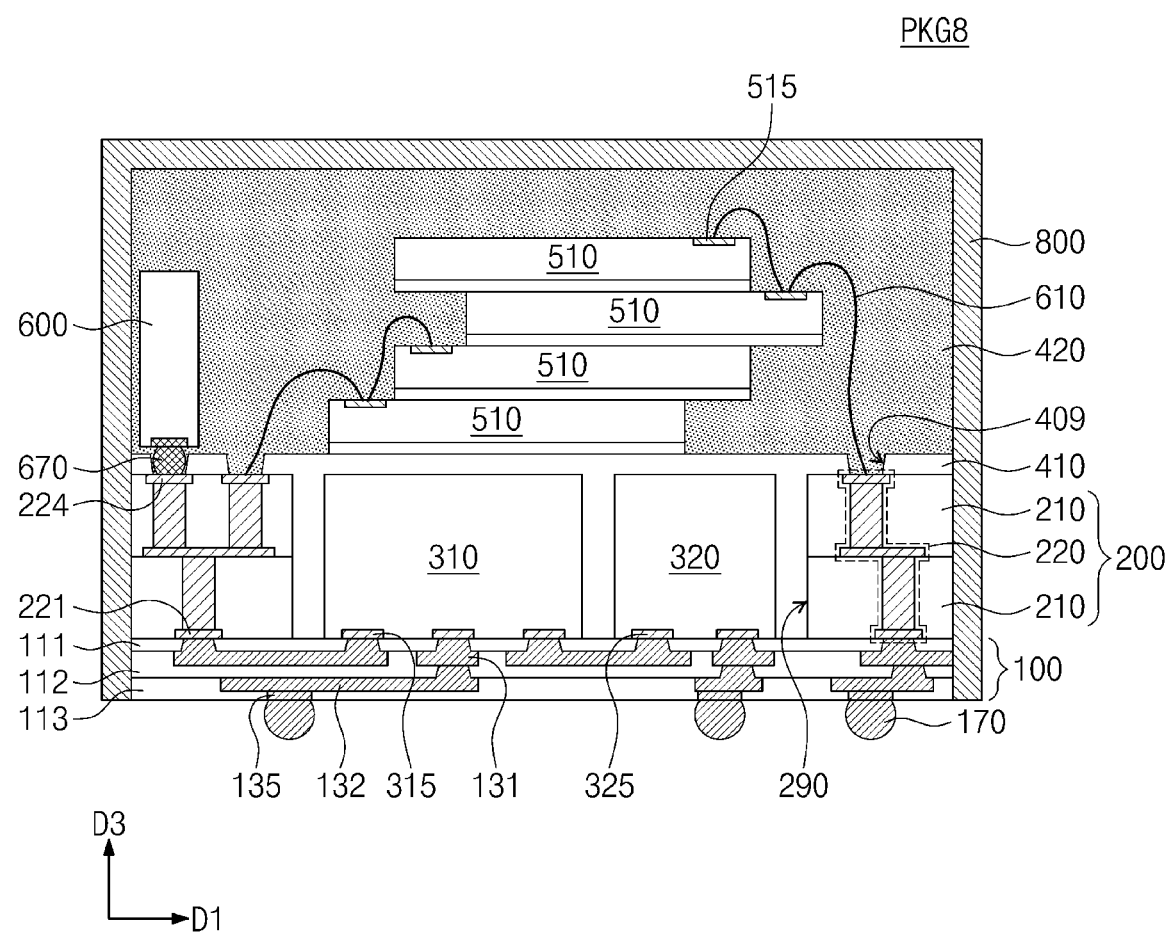

FIG. 6I illustrates a cross-sectional view showing a semiconductor package according to embodiments of the inventive concepts.

Referring to FIG. 6I, a semiconductor package PKG8 includes a redistribution substrate 100, lower semiconductor chips 310 and 320, a connection substrate 200, a lower molding layer 410, first upper semiconductor chips 510, first connection terminals 610, an upper molding layer 420, and a shield layer 800. One of redistribution patterns 131 and 132, for example a first redistribution pattern 131, is exposed on a side surface of the redistribution substrate 100. The exposed first redistribution pattern 131 may be configured to receive a ground voltage through external terminals 170.

The shield layer 800 may cover the side surface of the redistribution substrate 100, an outer side surface of the connection substrate 200, an outer side surface of the lower molding layer 410, and top and outer side surfaces of the upper molding layer 420. The shield layer 800 may include a conductive material, such as metal. The shield layer 800 contacts the first redistribution pattern 131 exposed on the side surface of the redistribution substrate 100. The shield layer 800 may therefore be electrically grounded. The shield layer 800 may shield the semiconductor package PKG8 from electromagnetic interference (EMI). Communication operations of electrical devices may be degraded from disturbances caused by electromagnetic waves emitted or transmitted from other electrical devices. In embodiments of the inventive concepts, because the semiconductor package PKG8 includes the shield layer 800, the lower semiconductor chips 310 and 320 and the first upper semiconductor chips 510 may be prevented from interrupting operations of other electronic devices or being interrupted by operations of other electronic devices.

It may be required that the shield layer 800 be electrically insulated from the first connection terminals 610 or conductive connector 670. However, if the upper molding layer 420 is spaced apart from the lower molding layer 410, the first connection terminals 610 or the conductive connector 670 may be exposed to the outside. In this case, the formation of the shield layer 800 may become complicated. In embodiments of the inventive concepts, the upper molding layer 420 directly physically contacts a top surface of the lower molding layer 410, and the outer side surface of the upper molding layer 420 is aligned with the outer side surface of the lower molding layer 410 and the side surface of the connection substrate 200. Thus, neither the first connection terminals 610 nor the conductive connector 670 are exposed by the upper molding layer 420 and the lower molding layer 410. Therefore, the formation of the shield layer 800 becomes simplified. For example, the shield layer 800 on the upper molding layer 420 and the shield layer 800 on the side surface of the connection substrate 200 may be formed by a single process and connected to each other without a boundary therebetween.

Differently from that shown in FIG. 6I, in other embodiments of the inventive concepts a redistribution pattern such as second redistribution pattern 132 may be exposed on the side surface of the redistribution substrate 100. In this case, the shield layer 800 may contact the second redistribution pattern 132 and receive a ground voltage.

In certain embodiments, the shield layer 800 described with respect to FIG. 6I may further be included in the semiconductor package PKG2 of FIG. 6A, the semiconductor package PKG3 of FIG. 6B, the semiconductor package PKG4 of FIG. 6C, the semiconductor package PKG5 of FIGS. 6D and 6E, the semiconductor package PKG5' of FIG. 6F, the semiconductor package PKG6 of FIG. 6G, the semiconductor package PKG7 of FIG. 6H, and a semiconductor package PKG9 which will be described hereinafter with reference to FIG. 7D.

FIGS. 7A to 7D illustrate cross-sectional views taken along line I-II of FIG. 2A, showing a method of fabricating a semiconductor package according to embodiments of the inventive concepts.

Figure 7A:
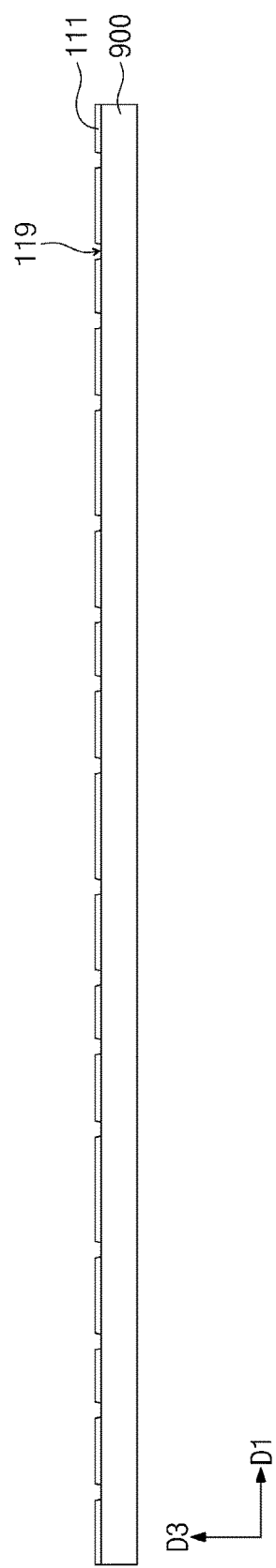
FIGS. 7A, 7B, 7C and 7D illustrate cross-sectional views showing a method of fabricating a semiconductor package according to some exemplary embodiments of the present inventive concepts.

Referring to FIGS. 2A and 7A, a coating process is performed to form a first dielectric layer 111 on a temporary substrate 900. Exposure and development processes may be performed such that the first dielectric layer 111 is patterned to form first via holes 119 therein. The same method described with reference to FIG. 3A may be employed to coat and pattern the first dielectric layer 111. In contrast to FIG. 3A, the first via holes 119 may expose the temporary substrate 900.

Figure 7B:
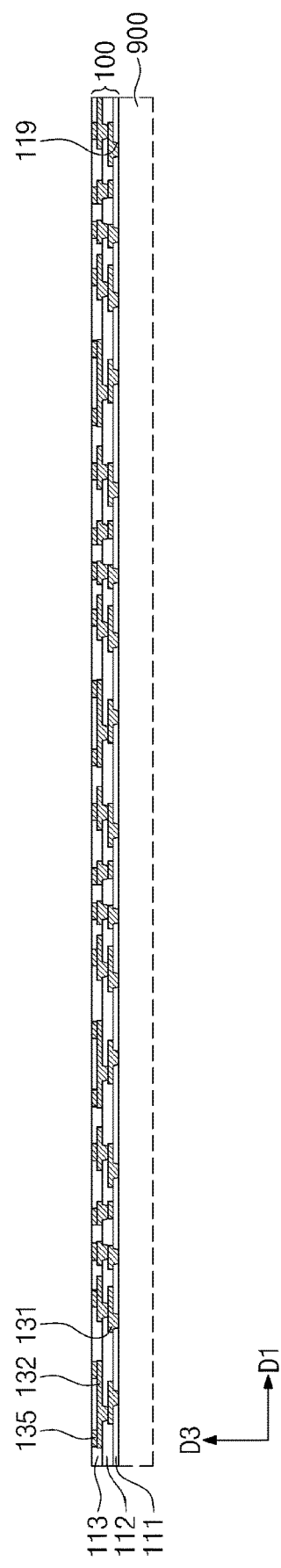

Referring to FIGS. 2A and 7B, a first redistribution pattern 131, a second dielectric layer 112, a second redistribution pattern 132, a third dielectric layer 113, and a conductive pad 135 are sequentially formed on the first dielectric layer 111, with the result that a redistribution substrate 100 may be fabricated. The first redistribution pattern 131, the second dielectric layer 112, the second redistribution pattern 132, the third dielectric layer 113, and the conductive pad 135 may be formed by the same method described with respect to FIGS. 3B and 3C. For example, the first redistribution pattern 131 may be disposed on the first dielectric layer 111 and provided in the first via holes 119.

Figure 7C:
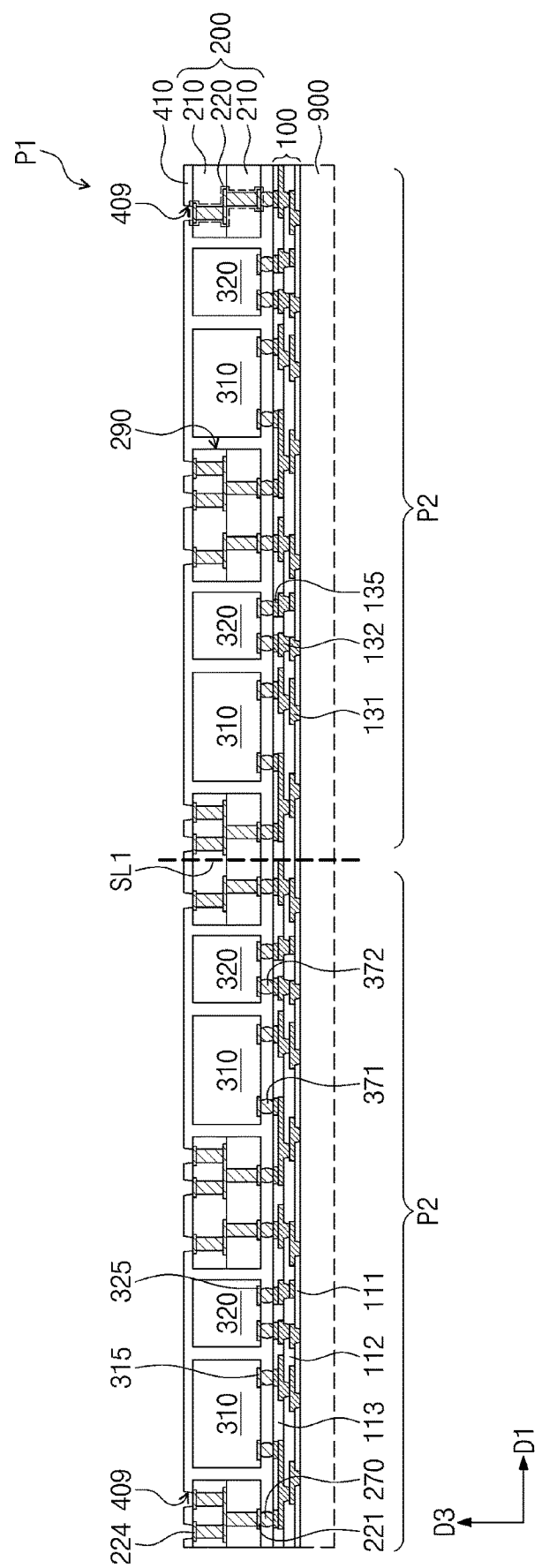
Figure 7D:
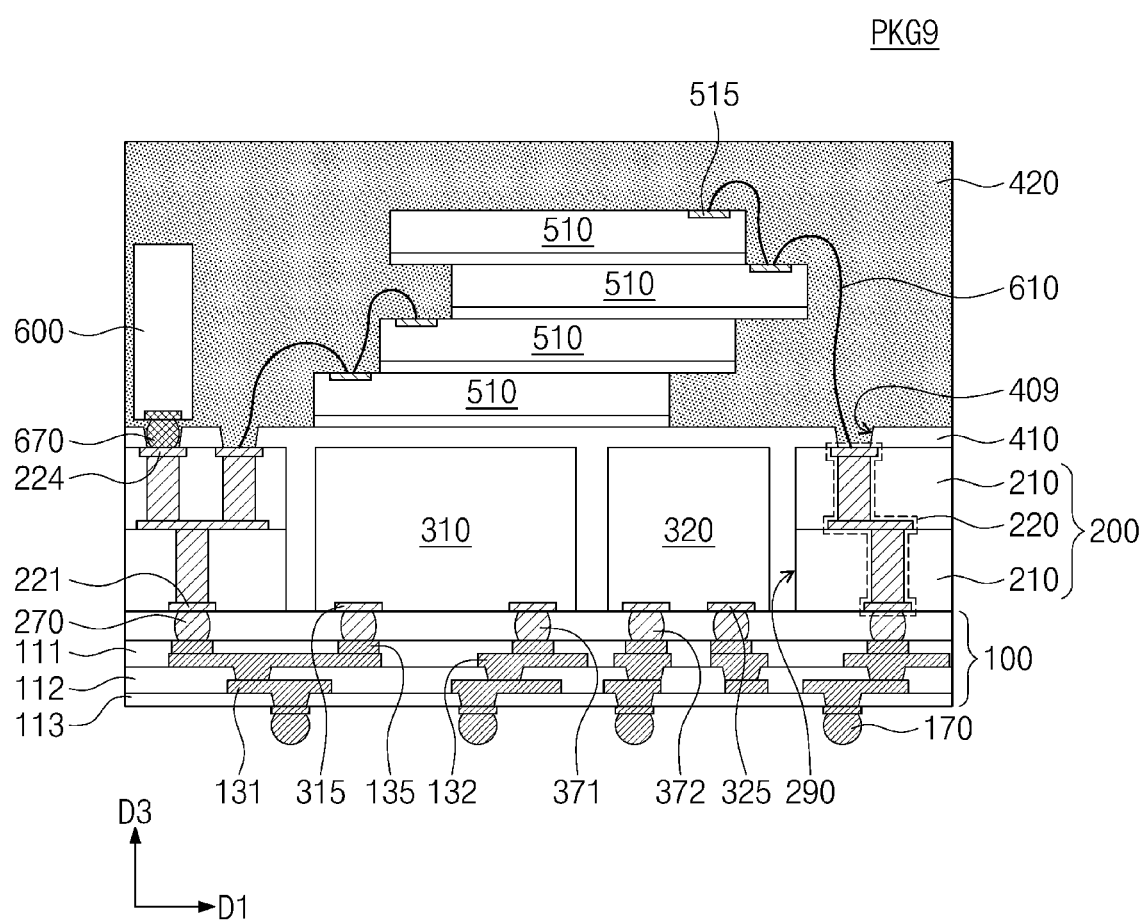

Referring to FIGS. 2A and 7C, first and second lower semiconductor chips 310 and 320 are provided on the redistribution substrate 100, for example, on the third dielectric layer 113. The first lower semiconductor chips 310 are provided on the redistribution substrate 100 with chip pads 315 facing the third dielectric layer 113. First connectors 371 are formed between the redistribution substrate 100 and the first lower semiconductor chips 310, and thus are coupled to the chip pads 315 of the first lower semiconductor chips 310 and also to the conductive pads 135. The first lower semiconductor chips 310 may be electrically connected through the first connectors 371 to the redistribution substrate 100.

The second lower semiconductor chips 320 are provided on the redistribution substrate 100 with chip pads 325 facing the third dielectric layer 113. Second connectors 372 are formed between the redistribution substrate 100 and the second lower semiconductor chips 320, and thus are coupled to the chip pads 325 of the second lower semiconductor chips 320 and also to the conductive pads 135. The second lower semiconductor chips 320 may be electrically connected through the second connectors 372 to the redistribution substrate 100.

A connection substrate 200 is provided on the redistribution substrate 100, for example, on the third dielectric layer 113. The first and second lower semiconductor chips 310 and 320 may be disposed in each hole 290. Third connectors 270 are formed between the redistribution substrate 100 and the connection substrate 200, and thus electrically connected to corresponding lower pads 221 and corresponding conductive pads 135. The connection substrate 200 may be electrically connected through the third connectors 270 to the redistribution substrate 100. The first, second and third connectors 371, 372 and 270 may include solder balls, bumps, or pillars.

A lower molding layer 410 is formed on the redistribution substrate 100, covering the first and second lower semiconductor chips 310 and 320 and a top surface of the connection substrate 200. The lower molding layer 410 may further extend into a gap between the first lower semiconductor chip 310 and the redistribution substrate 100, a gap between the second lower semiconductor chip 320 and the redistribution substrate 100, and a gap between the first and second lower semiconductor chips 310 and 320, and thus may encapsulate the first and second connectors 371 and 372. Differently from that shown in FIG. 7C, in other embodiments an under-fill layer may further be formed between the redistribution substrate 100 and each of the first and second lower semiconductor chips 310 and 320.

The lower molding layer 410 is patterned to form openings 409 therein. The openings 409 may be formed by the method described with respect to FIG. 5A or described with respect to FIGS. 5B and 5C. The temporary substrate 900 may be removed to expose a bottom surface of the redistribution substrate 100, for example, to expose the first dielectric layer 111 and a portion of the first redistribution pattern 131. The aforementioned processes may fabricate a panel package P1.

Afterwards, as described with respect to FIGS. 2E and 2F, the redistribution substrate 100, the connection substrate 200, and the lower molding layer 410 may be sawed along first sawing lines SL1 to separate strip packages P2 from each other.

Referring to FIGS. 4A to 4E and 7D, first upper semiconductor chips 510 are provided on a top surface of the lower molding layer 410. First connection terminals 610 are formed to directly contact corresponding chip pads 515 of the first upper semiconductor chips 510 and corresponding upper pads 224. An upper molding layer 420 is formed on the top surface of the lower molding layer 410, encapsulating the first upper semiconductor chips 510 and the first connection terminals 610. External terminals 170 may be formed on corresponding exposed bottom surfaces of the first redistribution patterns 131. Metal pads may further be interposed between the external terminals 170 and the first redistribution patterns 131.

The first upper semiconductor chips 510, the first connection terminals 610, the upper molding layer 420, and the external terminals 170 may be formed in a strip level, as described with respect to FIGS. 4A to 4C. After that, as described with respect to FIGS. 4D and 4E, the redistribution substrate 100, the connection substrate 200, the lower molding layer 410, and the upper molding layer 420 may be sawed along second sawing lines SL2. Therefore, a semiconductor package PKG9 may be fabricated as shown in FIG. 7D. A chip-last process may be utilized to form the semiconductor package PKG9.

The method described with respect to FIGS. 7A to 7D may be used to form the semiconductor package PKG2 of FIG. 6A, the semiconductor package PKG3 of FIG. 6B, the semiconductor package PKG4 of FIG. 6C, the semiconductor package PKG5 of FIGS. 6D and 6E, the semiconductor package PKG5' of FIG. 6F, the semiconductor package PKG6 of FIG. 6G, the semiconductor package PKG7 of FIG. 6H, and the semiconductor package PKG8 of FIG. 6I. In such cases, the third connectors 270 may be formed between the connection substrate 200 and the redistribution substrate 100. The first connectors 371 may be formed between the first lower semiconductor chip 310 and the redistribution substrate 100. The second connectors 372 may be formed between the second lower semiconductor chip 320 and the redistribution substrate 100, or between the third lower semiconductor chips 330 and the redistribution substrate 100.

According to the inventive concepts, an upper molding layer directly physically contacts a lower molding layer. First connection terminals directly contact first upper semiconductor chips and a connection substrate. Accordingly, a semiconductor package that is compact-sized may be realized.

The providing of the first upper semiconductor chips, the formation of the first connection terminals, and the formation of the upper molding layer may be performed in a strip level, and then semiconductor packages may be separated by a sawing process. As a result, the fabrication of semiconductor packages may be simplified.

The detailed description of the present inventive concepts may be used in various other combinations, modifications, and environments without departing from the subject matter of the present inventive concepts.

What is claimed is:

1. A method of fabricating a semiconductor package, the method comprising:
   preparing a panel package, the panel package including a redistribution substrate, a connection substrate on the redistribution substrate and a plurality of lower semiconductor chips on the redistribution substrate;
   sawing the panel package to form a plurality of strip packages separated from each other, each of the strip packages including a sawed portion of the redistribution substrate, at least two of the lower semiconductor chips, and a sawed portion of the connection substrate;
   providing a plurality of upper semiconductor chips on one of the strip packages and electrically connecting the upper semiconductor chips to the sawed portion of the connection substrate of the one of the strip packages;
   forming an upper molding layer on the one of the strip packages to cover the upper semiconductor chips; and
   sawing the one of the strip packages and the upper molding layer to form a plurality of separated packages after the forming the upper molding layer.

2. The method of claim 1, wherein the upper semiconductor chips include chip pads thereon, and the connection substrate of the one of the strip packages includes upper pads thereon,
   wherein the electrically connecting the upper semiconductor chips to the sawed portion of the connection substrate comprises forming a plurality of first connection terminals that are directly coupled to the chip pads of the upper semiconductor chips and to the upper pads of the connection substrate of the one of the strip packages.

3. The method of claim 1, wherein the preparing the panel package comprises:
   providing the connection substrate on a temporary substrate, the connection substrate having a plurality of holes;

providing the lower semiconductor chips on the temporary substrate, the lower semiconductor chips being disposed in the holes of the connection substrate;

forming a lower molding layer on the temporary substrate to cover the lower semiconductor chips and the connection substrate; and removing the temporary substrate to expose bottom surfaces of the lower semiconductor chips and a bottom surface of the connection substrate.

4. The method of claim 3, wherein the preparing the panel package further comprises forming the redistribution substrate on the bottom surfaces of the lower semiconductor chips and the bottom surface of the connection substrate exposed by the removing the temporary substrate.

5. The method of claim 3, wherein the upper molding layer directly contacts the lower molding layer.

6. The method of claim 1, wherein the connection substrate comprises:
  a plurality of base layers;
  a connection line pattern between the base layers;
  a plurality of vias penetrating the base layers and coupled to the connection line pattern;
  an upper pad exposed on a top surface of the connection substrate and coupled to at least one of the vias; and
  a lower pad exposed on a bottom surface of the connection substrate and coupled to another one of the vias.

7. The method of claim 6, wherein the upper pad is not vertically aligned with the lower pad.

8. The method of claim 1, wherein the preparing the panel package comprises:
  forming a plurality of first connectors between the redistribution substrate and the lower semiconductor chips; and
  forming a plurality of second connectors between the redistribution substrate and the connection substrate,
  wherein the first connectors include solder balls, bumps, or pillars, and
  wherein the second connectors include solder balls, bumps, or pillars.

9. A method of fabricating a semiconductor package, the method comprising:
  preparing a panel package, the panel package including a redistribution substrate, a connection substrate on the redistribution substrate and a plurality of lower semiconductor chips on the redistribution substrate;
  sawing the panel package to form a plurality of strip packages separated from each other, each of the strip packages including a sawed portion of the redistribution substrate, at least two of the lower semiconductor chips, and a sawed portion of the connection substrate; and
  providing a plurality of upper semiconductor chips on one of the strip packages and electrically connecting the upper semiconductor chips to the sawed portion of the connection substrate of the one of the strip packages,
  wherein forming the connection substrate comprises
  forming a plurality of base layers with connection line patterns between the base layers,
  forming a plurality of vias penetrating the base layers and coupled to the connection line patterns,
  forming upper pads exposed on a top surface of the connection substrate and coupled to first ones of the vias, and
  forming lower pads exposed on a bottom surface of the connection substrate and coupled to other ones of the vias,
  wherein a first upper pad of the upper pads is electrically connected to a first lower pad of the lower pads, and
  wherein at least a portion of the first upper pad is not vertically overlapped with the first lower pad.

10. The method of claim 9, wherein the upper semiconductor chips include chip pads thereon, and
  wherein the electrically connecting the upper semiconductor chips to the sawed portion of the connection substrate comprises forming a plurality of first connection terminals that are directly coupled to the chip pads of the upper semiconductor chips and to the upper pads of the connection substrate of the one of the strip packages.

11. The method of claim 10, wherein the preparing the panel package further comprises:
  forming a lower molding layer over the connection substrate and the lower semiconductor chips; and
  forming a plurality of openings in the lower molding layer to expose the upper pads.

12. The method of claim 11, wherein the forming the openings is performed by a laser drilling process,
  wherein widths of the openings are equal to or less than widths of the upper pads.

13. The method of claim 9, wherein the preparing the panel package comprises:
  providing the connection substrate on a temporary substrate, the connection substrate having a plurality of holes;
  providing the lower semiconductor chips on the temporary substrate, the lower semiconductor chips being disposed in the holes of the connection substrate;
  forming a lower molding layer on the temporary substrate to cover the lower semiconductor chips and the connection substrate; and
  removing the temporary substrate to expose bottom surfaces of the lower semiconductor chips and a bottom surface of the connection substrate.

14. The method of claim 13, wherein the preparing the panel package further comprises forming the redistribution substrate on the bottom surfaces of the lower semiconductor chips and the bottom surface of the connection substrate exposed by the removing the temporary substrate.

15. The method of claim 13, further comprising forming an upper molding layer on the one of the strip packages to cover the upper semiconductor chips, wherein the upper molding layer directly contacts the lower molding layer.

16. The method of claim 15, further comprising sawing the one of the strip packages and the upper molding layer to form a plurality of separated packages after the forming the upper molding layer.

17. The method of claim 9, wherein the preparing the panel package comprises:
  forming a plurality of first connectors between the redistribution substrate and the lower semiconductor chips; and
  forming a plurality of second connectors between the redistribution substrate and the connection substrate,
  wherein the first connectors include solder balls, bumps, or pillars, and
  wherein the second connectors include solder balls, bumps, or pillars.

* * * * *